(12) United States Patent
Masuda et al.

(10) Patent No.: US 10,833,272 B2
(45) Date of Patent: Nov. 10, 2020

(54) LAMINATE AND KIT

(71) Applicant: FUJIFILM Corporation, Tokyo (JP)

(72) Inventors: Seiya Masuda, Haibara-gun (JP); Yoshitaka Kamochi, Haibara-gun (JP); Atsushi Nakamura, Zwijndrecht (BE)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/787,990

(22) Filed: Oct. 19, 2017

(65) Prior Publication Data

US 2018/0040824 A1    Feb. 8, 2018

Related U.S. Application Data

(63) Continuation of application No. PCT/JP2016/063131, filed on Apr. 27, 2016.

(30) Foreign Application Priority Data

Apr. 28, 2015   (JP) ................. 2015-092287

(51) Int. Cl.
   *H01L 51/00*   (2006.01)
   *G03F 7/16*    (2006.01)
   (Continued)

(52) U.S. Cl.
   CPC .......... *H01L 51/0018* (2013.01); *B32B 27/30* (2013.01); *C08F 220/28* (2013.01);
   (Continued)

(58) Field of Classification Search
   CPC ... H01L 51/00; H01L 51/001; H01L 51/0018; H01L 51/50; G03F 7/03; G03F 7/038;
   (Continued)

(56) References Cited

U.S. PATENT DOCUMENTS 6,268,106 B1 * 7/2001 Park ................. G03F 7/0045
                                                        430/270.1
2013/0189627 A1   7/2013 Yamamoto et al.
(Continued)

FOREIGN PATENT DOCUMENTS

JP   2006-058497 A   3/2006
JP   2012-168503 A   9/2012
(Continued)

OTHER PUBLICATIONS

International Search Report for PCT/JP2016/063131 dated Jul. 26, 2016 [PCT/ISA/210].
(Continued)

*Primary Examiner* — Monica D Harrison
(74) *Attorney, Agent, or Firm* — Sughrue Mion, PLLC

(57) ABSTRACT

Provided are a laminate which includes an organic semiconductor film, a water-soluble resin layer, and a photosensitive resin layer and in which cracks are unlikely to occur; and a kit.

The laminate includes a water-soluble resin layer containing a water-soluble resin and a photosensitive resin layer containing a photosensitive resin, which are provided in this order on an organic semiconductor film. The water-soluble resin layer and the photosensitive resin layer are adjacent to each other, the water-soluble resin is at least one of polyvinylpyrrolidone having a weight-average molecular weight of 300,000 or greater or polyvinyl alcohol having a weight-average molecular weight of 15,000 or greater, and the photosensitive resin has a weight-average molecular weight of 30,000 or greater.

12 Claims, 1 Drawing Sheet

(51) Int. Cl.
*B32B 27/30* (2006.01)
*C08F 220/28* (2006.01)
*G03F 7/038* (2006.01)
*G03F 7/039* (2006.01)
*G03F 7/11* (2006.01)
*G03F 7/32* (2006.01)

(52) U.S. Cl.
CPC .......... *G03F 7/0382* (2013.01); *G03F 7/0392* (2013.01); *G03F 7/0397* (2013.01); *G03F 7/11* (2013.01); *G03F 7/162* (2013.01); *G03F 7/168* (2013.01); *G03F 7/325* (2013.01); *B32B 2309/105* (2013.01); *B32B 2457/14* (2013.01); *C08F 2220/281* (2013.01)

(58) Field of Classification Search
CPC ...... G03F 7/0382; G03F 7/039; G03F 7/0392; G03F 7/0397; G03F 7/11; G03F 7/16; G03F 7/162; G03F 7/168; G03F 7/32; G03F 7/325
USPC .......................................................... 257/40
See application file for complete search history.

(56) References Cited

U.S. PATENT DOCUMENTS

| | | |
|---|---|---|
| 2014/0322914 A1 | 10/2014 | Yamamoto et al. |
| 2015/0044608 A1 | 2/2015 | Yasuda et al. |
| 2015/0221881 A1 | 8/2015 | Iwai et al. |
| 2016/0170303 A1* | 6/2016 | Kamochi .............. G03F 7/0045 430/271.1 |

FOREIGN PATENT DOCUMENTS

| | | | |
|---|---|---|---|
| JP | 2013-023589 A | 2/2013 | |
| JP | 2014-044810 A | 3/2014 | |
| JP | 2014-098889 A | 5/2014 | |
| JP | 2014098889 A * | 5/2014 | ........ H01L 21/02118 |
| JP | 2014-175135 A | 9/2014 | |
| KR | 10-2014-0012614 A | 2/2014 | |
| KR | 10-2015-0018417 A | 2/2015 | |
| TW | 201229693 A | 7/2012 | |
| TW | 201509664 A | 3/2015 | |
| WO | 2015/025949 | 2/2015 | |
| WO | 2015/025949 A1 | 2/2015 | |

OTHER PUBLICATIONS

International Preliminary Report on Patentability dated Oct. 31, 2017 in counterpart International Application No. PCT/JP2016/063131.
English Translation of a Written Opinion dated Jul. 26, 2016 in International Application No. PCT/JP2016/063131.
Office Action dated Aug. 14, 2018 from the Japanese Patent Office in counterpart Japanese Application No. 2017-515563.
Office Action dated Oct. 26, 2018, from Korean Intellectual Property Office in counterpart Korean Application No. 10-2017-7030911.
Office Action dated Aug. 6, 2019 in counterpart Korean Application No. 10-2017-7030911
Office Action dated Apr. 14, 2019 issued by the Korean Intellectual Property Office in corresponding Korean Application No. 10-2017-7030911.
Office Action dated Sep. 25, 2019 in Korean Patent Application No. 10-2019-7025550.
Office Action dated Oct. 3, 2019, from the Taiwanese Intellectual Property Office in Taiwanese application No. 105113009.
Office Action dated Mar. 3, 2020 issued by the Korean Intellectual Property Office in corresponding Korean Application No. 10-2019-7025550.
Office Action dated Apr. 24, 2020 in Korean Application No. 10-2019-7025550.

* cited by examiner

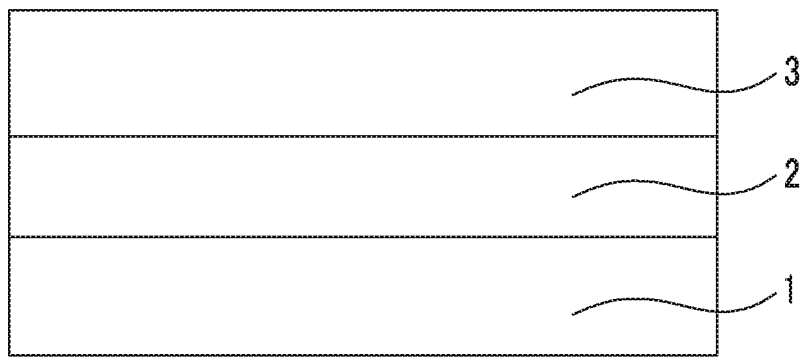

LAMINATE AND KIT

CROSS-REFERENCE TO RELATED APPLICATIONS

This application is a Continuation of PCT International Application No. PCT/JP2016/063131 filed on Apr. 27, 2016, which claims priority under 35 U.S.C § 119(a) to Japanese Patent Application No. 2015-092287 filed on Apr. 28, 2015. Each of the above application(s) is hereby expressly incorporated by reference, in its entirety, into the present application.

BACKGROUND OF THE INVENTION

1. Field of the Invention

The present invention relates to a laminate and a kit. More specifically, the present invention relates to a laminate and a kit which are used for manufacturing an organic semiconductor.

2. Description of the Related Art

In recent years, electronic devices using an organic semiconductor have been widely used. An organic semiconductor has an advantage that it can be manufactured by a simpler process than that of a device of the related art obtained by using an inorganic semiconductor such as silicon. In addition, it is considered that material characteristics can be easily changed by changing the molecular structure, the variations of materials are abundant, and functions or elements which have not been obtained by an inorganic semiconductor can be realized. For example, an organic semiconductor can be applied to electronic devices such as an organic solar cell, an organic electroluminescence display, an organic light detector, an organic field effect transistor, an organic electroluminescence light emitting device, a gas sensor, an organic rectifier device, an organic inverter, and an information recording element.

Patterning of an organic semiconductor has been performed using printing technology, but there is a limit to fine processing when the patterning is performed using printing technology. Further, the organic semiconductor tends to be easily damaged.

Patterning of an organic semiconductor performed by using a water-soluble resin has been examined. For example, JP2014-044810A discloses a method of manufacturing an organic EL device, in which a plurality of organic EL elements having at least a light emitting layer are disposed and the light emitting layer is patterned in a predetermined shape, including a step of forming an organic compound layer, on a substrate, which has at least a light emitting layer; a step of forming an interlayer on the organic compound layer; a step of forming a protective layer which covers the interlayer; a step of forming a resist layer on a predetermined region using photolithography; a step of removing the protective layer, the interlayer, and the organic compound layer provided in a region which is not covered by the resist layer through dry etching; and a step of removing a layer formed on the organic compound layer remaining on the substrate, in which the step of forming an interlayer includes a step of coating the organic compound layer with a solution containing a water-soluble material to form a coating film and a step of drying the coating film, and steps from the step of drying the coating film to the step of forming a protective layer are performed in an inert gas atmosphere.

SUMMARY OF THE INVENTION

As the result of examination conducted by the present inventors, as described in JP2014-044810A, it has been found that cracks are likely to occur in a case where an interlayer (for example, a water-soluble resin layer) or a protective layer is provided on a surface of an organic compound layer (for example, an organic semiconductor film) and a resist layer (for example, a photosensitive resin layer) is further laminated thereon. The present invention has been made in order to solve the above-described problems and an object thereof is to provide a laminate which includes an organic semiconductor film, a water-soluble resin layer, and a photosensitive resin layer and in which cracks are unlikely to occur; and a kit.

Under the above-described circumstances, as the result of intensive research conducted by the present inventors, it has been found that occurrence of cracks can be effectively suppressed by using a compound having a certain weight-average molecular weight or greater as a water-soluble resin used for a water-soluble resin layer and a photosensitive resin used for a photosensitive resin layer.

Specifically, the above-described problems have been solved by the following means <1> or preferably by <2> to <15>.

<1> A laminate comprising: a water-soluble resin layer which contains a water-soluble resin and a photosensitive resin layer which contains a photosensitive resin, which are provided in this order on an organic semiconductor film, in which the water-soluble resin layer and the photosensitive resin layer are adjacent to each other, the water-soluble resin is at least one of polyvinylpyrrolidone having a weight-average molecular weight of 300,000 or greater or polyvinyl alcohol having a weight-average molecular weight of 15,000 or greater, and the photosensitive resin has a weight-average molecular weight of 30,000 or greater.

<2> The laminate according to <1>, in which the photosensitive resin layer is a chemically amplified photosensitive resin layer.

<3> The laminate according to <1> or <2>, in which the photosensitive resin layer is a negative type photosensitive resin layer.

<4> The laminate according to any one of <1> to <3>, in which an exposed portion of the photosensitive resin layer is hardly soluble in a developer containing an organic solvent.

<5> The laminate according to any one of <1> to <4>, in which the photosensitive resin has a cyclic ether ester structure.

<6> The laminate according to any one of <1> to <5>, in which the photosensitive resin has a constitutional unit having a group represented by Formula (1),

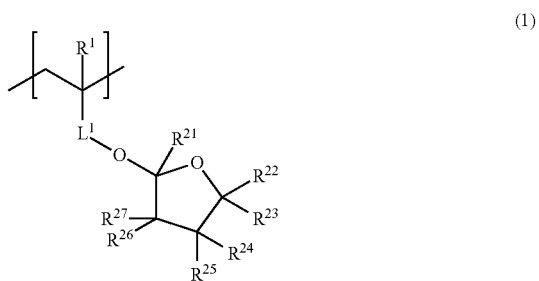

in Formula (1), $R^1$ represents a hydrogen atom or an alkyl group, $L^1$ represents a carbonyl group or a phenylene group, and $R^{21}$ to $R^{27}$ each independently represent a hydrogen atom or an alkyl group.

<7> The laminate according to any one of <1> to <6>, in which the weight-average molecular weight of the photosensitive resin is 40,000 or greater.

<8> The laminate according to any one of <1> to <7>, in which the amount of solvent contained in the water-soluble resin layer is in a range of 1% to 10% by mass, and the amount of organic solvent contained in the photosensitive resin layer is in a range of 1% to 10% by mass.

<9> The laminate according to any one of <1> to <8>, in which the thickness of the water-soluble resin layer is in a range of 0.1 to 10 μm, and the thickness of the photosensitive resin layer is in a range of 0.1 to 10 μm.

<10> The laminate according to any one of <1> to <9>, in which the amount of component having a weight-average molecular weight of 1,000 or less, which is contained in the water-soluble resin, is 10% by mass or less of the entire water-soluble resin component.

<11> The laminate according to any one of <1> to <10>, in which the amount of component having a weight-average molecular weight of 1,000 or less, which is contained in the photosensitive resin, is 10% by mass or less of the entire photosensitive resin component.

<12> The laminate according to any one of <1> to <11>, further comprising: a device substrate which is provided on a surface of the organic semiconductor film on a side far from the water-soluble resin layer.

<13> The laminate according to any one of <1> to <12>, in which the water-soluble resin layer is provided on a surface of the organic semiconductor film.

<14> A kit comprising: a composition for forming an organic semiconductor; a water-soluble resin composition which contains a water-soluble resin; and a photosensitive resin composition which contains a photosensitive resin, in which the water-soluble resin is at least one of polyvinylpyrrolidone having a weight-average molecular weight of 300,000 or greater or polyvinyl alcohol having a weight-average molecular weight of 15,000 or greater, and the photosensitive resin has a weight-average molecular weight of 30,000 or greater.

<15> A kit used for patterning of an organic semiconductor film, comprising: a water-soluble resin composition which contains a water-soluble resin; and a photosensitive resin composition which contains a photosensitive resin, in which the water-soluble resin is at least one of polyvinylpyrrolidone having a weight-average molecular weight of 300,000 or greater or polyvinyl alcohol having a weight-average molecular weight of 15,000 or greater, and the photosensitive resin has a weight-average molecular weight of 30,000 or greater.

According to the present invention, it is possible to provide a laminate which includes an organic semiconductor film, a water-soluble resin layer, and a photosensitive resin layer and in which cracks are unlikely to occur; and a kit.

BRIEF DESCRIPTION OF THE DRAWINGS

FIG. 1 is a view schematically illustrating a laminate of the present invention.

DESCRIPTION OF THE PREFERRED EMBODIMENTS

The constitutional elements of the present invention described below will be described based on representative embodiments of the present invention, but the present invention is not limited to such embodiments.

In regard to notation of a group (atomic group) in the present specification, in a case where it is not noted whether a group includes a substituent or not, it means that a group with a substituent and a group without a substituent are both included. For example, when an "alkyl group" is noted, an alkyl group without a substituent (unsubstituted alkyl group) as well as an alkyl group with a substituent (substituted alkyl group) are included.

In addition, "active rays" in the present specification mean, for example, a line spectrum of a mercury lamp, far-ultraviolet rays represented by an excimer laser, extreme ultraviolet rays (EUV light), X-rays, and electron beams. In addition, the light in the present invention indicates active rays or radiation. Further, "exposure to light" in the present specification, unless otherwise specified, includes not only exposure to a mercury lamp, far-ultraviolet rays represented by excimer laser, X-rays, or EUV light, but also drawings using particle beams such as electron beams or ion beams.

The numerical ranges expressed using "to" in the present specification indicate the ranges including the numerical values described before and after "to" as the lower limits and the upper limits.

Moreover, in the present specification, "(meth)acrylate" indicates both or one of acrylate and methacrylate, "(meth)acryl" indicates both or one of acryl and methacryl, and "(meth)acryloyl" indicates both or one of acryloyl and methacryloyl.

"Steps" in the present specification include not only independent steps but also steps whose intended actions are achieved even in a case where the steps cannot be precisely distinguished from other steps.

The concentration of solid contents in the present specification indicates a percentage of a mass of other components from which a solvent is removed to the total mass of a composition.

A laminate of the present invention includes a water-soluble resin layer which contains a water-soluble resin and a photosensitive resin layer which contains a photosensitive resin, which are provided in this order on an organic semiconductor film. The water-soluble resin layer and the photosensitive resin layer are adjacent to each other, the water-soluble resin is at least one of polyvinylpyrrolidone having a weight-average molecular weight of 300,000 or greater or polyvinyl alcohol having a weight-average molecular weight of 15,000 or greater, and the photosensitive resin has a weight-average molecular weight of 30,000 or greater. With such a configuration, occurrence of cracks can be effectively suppressed. Further, dry etching resistance can be improved by suppressing the occurrence of cracks.

As the result of examination conducted by the present inventors, it was understood that cracks are likely to occur in the laminate that includes an organic semiconductor film, a water-soluble resin layer, and a photosensitive resin layer. It was speculated that cracks are likely to occur because low-molecular weight components of the water-soluble resin move to the photosensitive resin layer and low-molecular weight components of the photosensitive resin in the photosensitive resin layer are volatilized. For this reason, in the present invention, the occurrence of cracks is suppressed by employing the above-described configuration. In other words, it was considered that film surfaces of the water-soluble resin layer and the photosensitive resin layer are strengthened by increasing the weight-average molecular weight of the water-soluble resin or the photosensitive resin so that the movement or the volatilization of the low-molecular weight components is suppressed, and thus the occurrence of cracks can be suppressed. Further, it was considered that the amount of the low-molecular weight components is relatively decreased by increasing the weight-average molecular weights of the water-soluble resin and the photosensitive resin, and thus the movement or the volatilization of the low-molecular weight components can be suppressed.

FIG. 1 is a cross-sectional view illustrating the layer structure of the laminate of the present invention. The reference numeral 1 indicates an organic semiconductor film, the reference numeral 2 indicates a water-soluble resin layer, and the reference numeral 3 indicates a photosensitive resin layer. In the present invention, the water-soluble resin layer 2 and the photosensitive resin layer 3 are adjacent to each other, and one or two or more other layers may be interposed between the organic semiconductor film 1 and the water-soluble resin layer 2. As other layers, a water-soluble undercoat layer and the like are exemplified. In the present invention, it is preferable that the water-soluble resin layer is provided on the surface of the organic semiconductor film. In addition, the laminate of the present invention may include a device substrate on the surface of the organic semiconductor film on a side opposite to the water-soluble resin layer (not illustrated).

The numbers of layers of the organic semiconductor film, the water-soluble resin layer, and the photosensitive resin layer may be respectively one or two or more unless departing from the scope of the present invention, but are typically and respectively one.

Hereinafter, the layer structures of these will be described in detail.

<Organic Semiconductor Film>

The organic semiconductor film used in the present invention indicates a film containing an organic material showing characteristics of a semiconductor. Similar to a case of a semiconductor formed of an inorganic material, as the type of the organic semiconductor, there is a p-type organic semiconductor that conducts positive holes as a carrier and an n-type organic semiconductor that conducts electrons as a carrier. The flowability of a carrier in the organic semiconductor is expressed as a carrier mobility μ. Depending on the applications, the mobility is typically high, preferably $10^{-7}$ cm$^2$/Vs or greater, more preferably $10^{-6}$ cm$^2$/Vs or greater, and still more preferably $10^{-5}$ cm$^2$/Vs or greater. The mobility can be acquired by characteristics or a time-of-flight measurement (TOF) method at the time of preparation of a field effect transistor (FET) element.

As described above, it is preferable that the organic semiconductor film is formed on a substrate and then used. That is, it is preferable that the substrate is provided on a surface of the organic semiconductor film on a side far from the water-soluble resin layer. Examples of the substrate which can be used in the present invention include various materials, for example, silicon, quartz, ceramic, glass, a polyester film such as polyethylene naphthalene (PEN) or polyethylene terephthalate (PET), and a polyimide film, and any substrate may be selected according to the application thereof. For example, in a case where the substrate is used for a flexible element, a flexible substrate can be used. Moreover, the thickness of the substrate is not particularly limited.

Any of an organic semiconductor material may be used as the p-type semiconductor material which can be used for the organic semiconductor film used in the present invention as long as the material shows hole (positive hole) transporting properties, preferred examples thereof including a p-type π conjugated polymer (for example, substituted or unsubstituted polythiophene (for example, poly(3-hexylthiophene) (P3HT, manufactured by Sigma-Aldrich Japan)), polyselenophene, polypyrrole, polyparaphenylene, polyparaphenylene vinylene, polythiophene vinylene, or polyaniline), a condensed polycyclic compound (for example, substituted or unsubstituted anthracene, tetracene, pentacene, anthrathiophene, or hexabenzocoronene), a triarylamine compound (for example, m-MTDATA (4,4',4''-Tris[(3-methylphenyl)phenylamino] triphenylamine), 2-TNATA (4,4',4''-Tris[2-naphthyl(phenyl)amino] triphenylamine), NPD (N,N'-Di[(1-naphthyl)-N,N'-diphenyl]-1,1'biphenyl)-4,4'-diamine), TPD (N,N'-Diphenyl-N,N'-di(m-tolyl)benzidine, mCP (1,3-bis(9-carbazolyl)benzene), or CBP (4,4'-bis(9-carbazolyl)-2,2'-biphenyl)), a 5-membered heterocyclic compound (for example, a substituted or unsubstituted oligothiophene or TTF (Tetrathiafulvalene)), a phthalocyanine compound (various substituted or unsubstituted central metals such as phthalocyanine, naphthalocyanine, anthracyanine, or tetrapyrazinoporphyrazine), a porphyrin compound (various substituted or unsubstituted central metals such as porphyrin), carbon nanotubes, a semiconductor polymer modified with carbon nanotubes, and graphene; more preferred examples thereof including a p-type π conjugated polymer, a condensed polycyclic compound, a triarylamine compound, a 5-membered heterocyclic compound, a phthalocyanine compound, and a porphyrin compound; and still more preferred examples thereof including a p-type π conjugated polymer.

Any organic semiconductor material may be used as the n-type semiconductor material which can be used for the organic semiconductor film used in the present invention as long as the material shows electron transporting properties, preferred examples thereof including a fullerene compound, an electron deficient phthalocyanine compound, a naphthalene tetracarbonyl compound, a perylene tetracarbonyl compound, a TCNQ compound (tetracyanoquinodimethane compound), and an n-type conjugated polymer; more preferred examples thereof including a fullerene compound, an electron deficient phthalocyanine compound, a naphthalene tetracarbonyl compound, a perylene tetracarbonyl compound, and a n-type π conjugated polymer; and particularly preferred examples including a fullerene compound and an n-type π conjugated polymer. In the present invention, a fullerene compound indicates a substituted or unsubstituted fullerene compound and any of $C_{60}$, $C_{70}$, $C_{76}$, $C_{78}$, $C_{80}$, $C_{82}$, $C_{84}$, $C_{86}$, $C_{88}$, $C_{90}$, $C_{96}$, $C_{116}$, $C_{180}$, $C_{240}$, and $C_{540}$ may be used as a fullerene. As the fullerene compound, substituted or unsubstituted $C_{60}$, $C_{70}$, or $C_{86}$ is preferable and PCBM ([6,6]-phenyl-$C_{61}$-butyric acid methyl ester, manufactured by Sigma-Aldrich Japan) or an analog thereof (a compound obtained by substituting the $C_{60}$ portion with $C_{70}$ or $C_{86}$; a compound obtained by substituting the benzene ring substituent with another aromatic ring or a heterocyclic ring; or a compound obtained by substituting methyl ester with n-butyl ester or i-butyl ester) is particularly preferable. Examples of electron deficient phthalocyanines include phthalocyanine ($F_{16}$MPc, FPc-S8, or the like, here, M represents a central metal, Pc represents phthalocyanine, and S8 represents an n-octylsulfonyl group) of various central metals to which four or more electron-withdrawing groups are bonded, naphthalocyanine, anthracyanine, and substituted or unsubstituted tetrapyrazinoporphyrazine. The naphthalene tetracarbonyl compound is not particularly limited, and a naphthalene tetracarboxylic anhydride (NTCDA), a naphthalene bisimide compound (NTCDI), or a perinone pigment (Pigment Orange 43, Pigment Red 194, or the like) is preferable. The perylene tetracarbonyl compound is not particularly limited, and a perylene tetracarboxylic anhydride (PTCDA), a perylene bisimide compound (PTCDI), or a benzimidazole condensed ring (PV) is preferable. The TCNQ compound is substituted or unsubstituted TCNQ and a compound obtained by substituting a benzene ring portion of TCNQ with another aromatic ring or heterocyclic ring and examples thereof include TCNQ, TCAQ (tetracyanoquinodimethane), and TCN3T (2,2'-((2E,2"E)-3',4'-alkyl substitute d-5H,5"H-[2,2':5',2"-terthiophene]-5,5"-diylidene)dimalononitrile derivatives). Further, graphene may be exemplified. Particularly preferred examples of the n-type organic semiconductor materials are described below.

R in the formula is not particularly limited, and preferred examples thereof include a hydrogen atom, a substituted or unsubstituted and branched or linear alkyl group (having preferably 1 to 18 carbon atoms, more preferably 1 to 12 carbon atoms, and still more preferably 1 to 8 carbon atoms), and a substituted or unsubstituted aryl group (having preferably 6 to 30 carbon atoms, more preferably 6 to 20 carbon atoms, and still more preferably 6 to 14 carbon atoms).

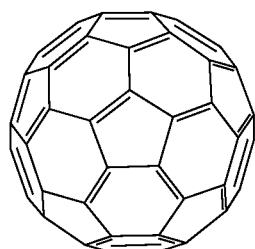

C60

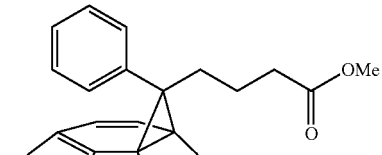

PCBM

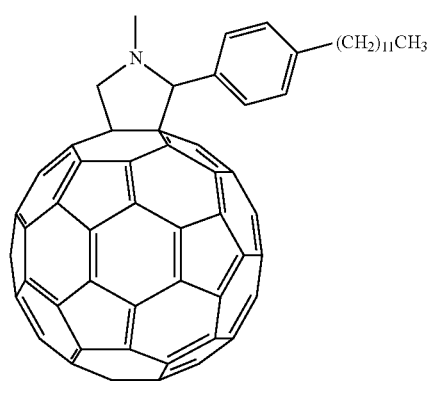

C60MC12

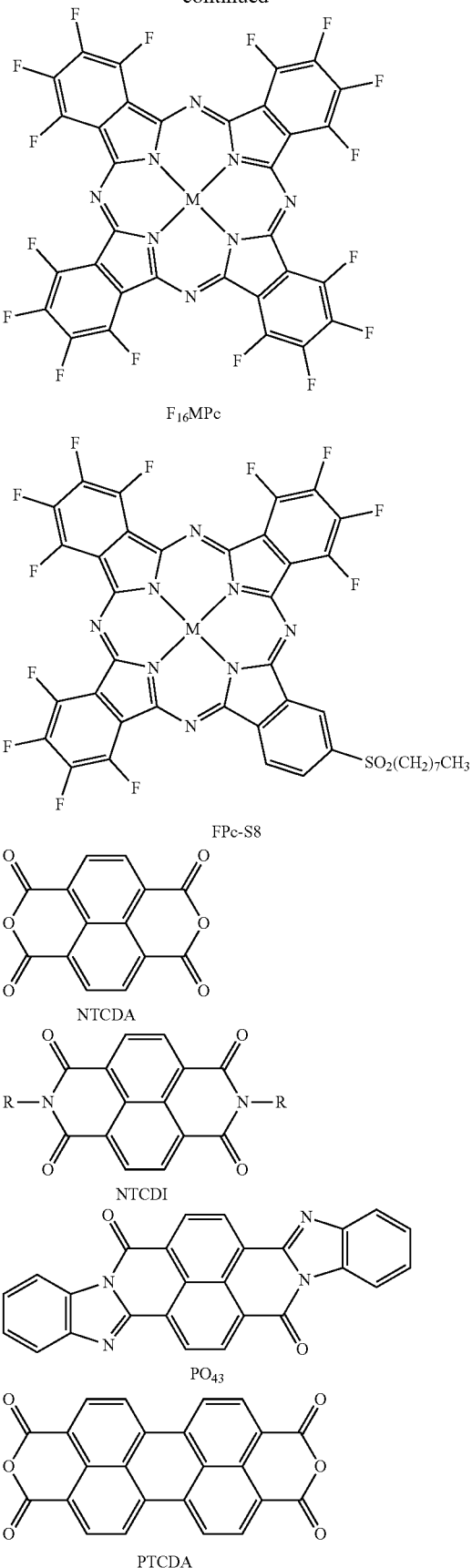

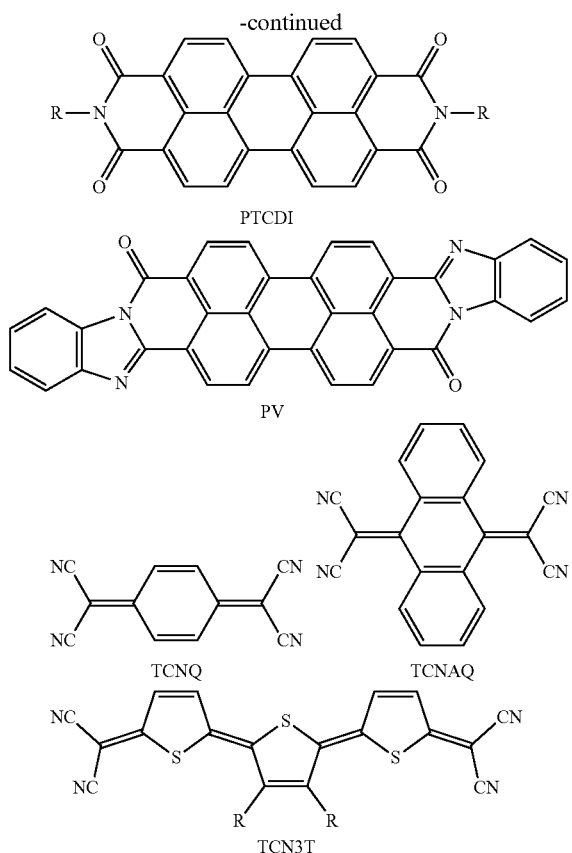

The organic material showing the characteristics of a semiconductor included in the organic semiconductor film may be used alone or in combination of two or more kinds thereof.

The above-described materials are used for film formation typically by being mixed into a solvent, being applied to have a layer form, and then being dried. As an application method, description of a water-soluble resin layer described below can be referred to.

Examples of the solvent include a hydrocarbon-based solvent such as hexane, octane, decane, toluene, xylene, ethylbenzene, or 1-methylnaphthalene; a ketone-based solvent such as acetone, methyl ethyl ketone, methyl isobutyl ketone, or cyclohexanone; a halogenated hydrocarbon-based solvent such as dichloromethane, chloroform, tetrachloromethane, dichloroethane, trichloroethane, tetrachloroethane, chlorobenzene, dichlorobenzene, or chlorotoluene; an ester-based solvent such as ethyl acetate, butyl acetate, or amyl acetate; an alcohol-based solvent such as methanol, propanol, butanol, pentanone, hexanone, cyclohexanone, methyl cellosolve, ethyl cellosolve, or ethylene glycol; an ether-based solvent such as dibutyl ether, tetrahydrofuran, dioxane, or anisole; and a polar solvent such as N,N-dimethylformamide, N,N-dimethylacetamide, 1-methyl-2-pyrrolidone, 1-methyl-2-imidazolidinone, or dimethyl sulfoxide. These solvents may be used alone or in combination of two or more kinds thereof.

The proportion of the organic semiconductor in a composition (composition for forming an organic semiconductor) that forms the organic semiconductor film is preferably in a range of 0.1% by mass to 80% by mass and more preferably in a range of 0.1% by mass to 30% by mass, and a film having an arbitrary thickness can be formed using the composition.

Further, a resin binder may be mixed with the composition for forming an organic semiconductor. In this case, a material that forms a film and a resin binder are dissolved in the above-described suitable solvent or dispersed therein to make a coating solution, and then a thin film can be formed using various coating methods. Examples of the resin binder include an insulating polymer such as polystyrene, polycarbonate, polyarylene, polyester, polyamide, polyimide, polyurethane, polysiloxane, polysulfone, polymethyl methacrylate, polymethyl acrylate, cellulose, polyethylene, or polypropylene and a copolymer of these; a photoconductive polymer such as polyvinyl carbazole or polysilane; and a conductive polymer such as polythiophene, polypyrrole, polyaniline, or polyparaphenylene vinylene. These resin binders may be used alone or in combination of two or more kinds thereof. In a case where mechanical strength of a thin film is considered, a resin binder having a high glass transition temperature is preferable. Further, in a case where charge mobility is considered, a resin binder formed of a photoconductive polymer having a structure, which does not contain a polar group, and/or a conductive polymer is preferable.

In a case where a resin binder is to be mixed in, the amount to be mixed in is preferably in a range of 0.1% by mass to 30% by mass in the organic semiconductor film. The resin binder may be used alone or in combination of two or more kinds thereof.

According to the application thereof, a mixed solution to which a single or various semiconductor materials or additives are added may be applied to a substrate or the like form a film blend formed of a plurality of materials. For example, in a case where a photoelectric conversion layer is prepared, a solution into which another semiconductor material is mixed can be used.

Moreover, at the time of film formation, a substrate may be heated or cooled, and the film quality or packing of molecules in the film can be controlled by changing the temperature of the substrate. The temperature of the substrate, which is not particularly limited, is preferably in a range of −200° C. to 400° C., more preferably in a range of −100° C. to 300° C., and still more preferably in a range of 0° C. to 200° C.

The characteristics of the formed organic semiconductor film can be adjusted by carrying out a post-treatment. For example, the characteristics can be improved by changing a morphology of the film or a packing of molecules of the film by performing a heat treatment or exposing the film to a vaporized solvent. In addition, an oxidation or a reduction reaction is caused by exposing the film to a gas, a solvent, or a material having oxidizability or reducibility or mixing these, and the carrier density in the film can then be adjusted.

The film thickness of the organic semiconductor film is not particularly limited and varies depending on the kind of an electronic device to be used. The film thickness thereof is preferably in a range of 5 nm to 50 μm, more preferably in a range of 10 nm to 5 μm, and still more preferably in a range of 20 nm to 500 nm.

<<Water-Soluble Resin Layer>>

The water-soluble resin layer contains one or two or more water-soluble resins which are polyvinylpyrrolidone (PVP) having a weight-average molecular weight of 300,000 or greater and polyvinyl alcohol (PVA) having a weight-average molecular weight of 15,000 or greater. The water-soluble resin layer may contain both of polyvinylpyrrolidone having a weight-average molecular weight of 300,000 or greater and polyvinyl alcohol having a weight-average molecular weight of 15,000 or greater. Further, in the water-soluble resin layer of the present invention, the amount of component having a weight-average molecular weight of 1,000 or less, which is contained in the water-soluble resin, is preferably 10% by mass or less and more preferably 5% by mass or less based on the total amount of components in the water-soluble resin. In a case where the amount thereof is in the above-described range, the occurrence of cracks can be more effectively suppressed.

In addition, the water-soluble resin layer of the present invention may contain a solvent (preferably water). An example in which the amount of solvent contained in the water-soluble resin layer is in a range of 1% to 10% by mass will be described below.

The weight-average molecular weight of polyvinylpyrrolidone used in the present invention is preferably in a range of 300,000 to 1000,000.

The weight-average molecular weight of polyvinyl alcohol used in the present invention is preferably in a range of 15,000 to 100,000.

Further, the degree of dispersion (weight-average molecular weight/number average molecular weight) of the water-soluble resin (PVP, PVA described above) used in the present invention is preferably in a range of 1.0 to 5.0 and more preferably in a range of 2.0 to 4.0. The occurrence of cracks can be more effectively suppressed by setting the degree of dispersion thereof to be in the above-described range.

The thickness of the water-soluble resin layer is preferably 0.1 μm or greater, more preferably 0.5 μm or greater, still more preferably 1.0 μm or greater, and even still more preferably 2.0 μm or greater. The upper limit of the thickness of the water-soluble resin layer is preferably 10 μm or less, more preferably 5.0 μm or less, and still more preferably 3.0 μm or less.

The water-soluble resin layer used in the present invention is formed by applying a water-soluble resin composition containing one or two or more water-soluble resins to the organic semiconductor film and drying the film. The water-soluble resin composition typically contains water as a solvent and may contain other additives.

The concentration of solid contents in the water-soluble resin composition is preferably in a range of 0.5% to 30% by mass, more preferably in a range of 1.0% to 20% by mass, and still more preferably in a range of 2.0% to 14% by mass. The water-soluble resin composition can be uniformly applied by setting the concentration of solid contents to be in the above-described range.

As a method of applying the composition, coating is preferable. Examples of the application method include a casting method, a blade coating method, a wire bar coating method, a spray coating method, a dipping (immersion) coating method, a bead coating method, an air knife coating method, a curtain coating method, an ink-jet method, a spin coating method, and a Langmuir-Blodgett (LB) method. In the present invention, a casting method, a spin coating method, or an ink-jet method is more preferable. When such a process is carried out, it is possible to produce a film such as an organic semiconductor film whose surface is flat and which has a large area at a low cost.

It is preferable that the water-soluble resin composition contains a surfactant for the purpose of further improving coating properties.

Any of a non-ionic surfactant, an anionic surfactant, and an amphoteric fluorine-based surfactant may be used as a surfactant as long as surface tension can be decreased. Examples of the surfactant include non-ionic surfactants, for example, polyoxyethylene alkyl ethers such as polyoxyethylene lauryl ether, polyoxyethylene cetyl ether, and polyoxyethylene stearyl ether; polyoxyethylene alkyl allyl ethers such as polyoxyethylene octylphenyl ether and polyoxyethylene nonylphenyl ether; polyoxyethylene alkyl esters such as polyoxyethylene stearate; sorbitan alkyl esters such as sorbitan monolaurate, sorbitan monostearate, sorbitan distearate, sorbitan monooleate, sorbitan sesquioleate, and sorbitan trioleate; monoglyceride alkyl esters such as glycerol monostearate and glycerol monooleate; an oligomer containing fluorine or silicon; acetylene glycol; and an ethylene oxide adduct of acetylene glycol; anionic surfactants, for example, alkylbenzene sulfonates such as sodium dodecylbenzene sulfonate; alkylnaphthalene sulfonates such as sodium butylnaphthalene sulfonate, sodium pentylnaphthalene sulfonate, sodium hexylnaphthalene sulfonate, and sodium octylnaphthalene sulfonate; alkyl sulfates such as sodium lauryl sulfate; alkyl sulfonates such as sodium dodecyl sulfonate; and sulfosuccinates such as sodium dilauryl sulfosuccinate; and amphoteric surfactants, for example, alkyl betaines such as lauryl betaine and stearyl betaine; and amino acids. A non-ionic surfactant which has a small content of metal ions affecting electrical characteristics of an organic semiconductor, has excellent anti-foaming properties, and has an acetylene skeleton represented by Formula (1) is particularly preferable.

$$R^1\text{—}C\equiv C\text{—}R^2 \qquad (1)$$

In Formula (1), $R^1$ and $R^2$ each independently represent an alkyl group which may have a substituent and has 3 to 15 carbon atoms, an aromatic hydrocarbon group which may have a substituent and has 6 to 15 carbon atoms, or a heterocyclic aromatic group which may have a substituent and has 4 to 15 carbon atoms (examples of the substituent include an alkyl group having 1 to 20 carbon atoms, an aromatic hydrocarbon group having 6 to 15 carbon atoms, an aralkyl group having 7 to 17 carbon atoms, an alkoxy group having 1 to 20 carbon atoms, an alkoxycarbonyl group having 2 to 20 carbon atoms, or an acyl group having 2 to 15 carbon atoms).

In a case where the water-soluble resin layer composition contains a surfactant, the amount of the surfactant to be added is preferably in a range of 0.05% by mass to 8% by mass, more preferably in a range of 0.07% by mass to 5% by mass, and particularly preferably in a range of 0.1% by mass to 3% by mass when the water-soluble resin composition is obtained.

These surfactants may be used alone or in combination of two or more kinds thereof.

The water-soluble resin layer of the present invention may contain other water-soluble resins within the range not departing from the scope of the present invention. Other water-soluble resins indicate resins whose solubility in water at 20° C. is 1% by mass or greater and which do not correspond to PVP having a weight-average molecular weight of 300,000 or greater and PVA having a weight-average molecular weight of 15,000 or greater.

Examples of other water-soluble resins include water-soluble polysaccharides (water-soluble cellulose, (methyl cellulose, hydroxyethyl cellulose, hydroxypropyl cellulose, hydroxyethyl methyl cellulose, or hydroxypropyl methyl cellulose), pullulan or a pullulan derivative, starch, hydroxypropyl starch, carboxymethyl starch, chitosan, and cyclodextrin), polyethylene oxide, and polyethyl oxazoline. Among these, two or more kinds having main chain structures different from each other may be selected and then used or may be used as a copolymer.

It is preferable that the water-soluble resins of the present invention do not substantially include other water-soluble resins which do not correspond to PVP having a weight-average molecular weight of 300,000 or greater and PVA having a weight-average molecular weight of 15,000 or greater. Here, the expression "do not substantially include" means that the content of other water-soluble resins in the water-soluble resin components contained in the water-soluble resin layer is, for example, 5% by mass or less and preferably 1% by mass or less.

<<Photosensitive Resin Layer>>

The photosensitive resin layer used in the present invention contains a photosensitive resin having a weight-average molecular weight of 30,000 or greater. Preferably, the photosensitive resin is a resin which can be developed by a developer containing a solvent.

The weight-average molecular weight of the photosensitive resin in the present invention is preferably 40,000 or greater. The upper limit thereof is not particularly limited, but is preferably 100,000 or less and may be 70,000 or less. Further, the amount of component having a weight-average molecular weight of 1,000 or less, which is contained in the photosensitive resin, is preferably 10% by mass or less and more preferably 5% by mass or less based on the total amount of components of the photosensitive resin. The occurrence of cracks can be more effectively suppressed by setting the amount thereof to be in the above-described range.

Further, the degree of dispersion (weight-average molecular weight/number average molecular weight) of the photosensitive resin used in the present invention is preferably in a range of 1.0 to 4.0 and more preferably in a range of 1.1 to 2.5. The occurrence of cracks can be more effectively suppressed by setting the degree of dispersion thereof to be in the above-described range.

The photosensitive resin layer used in the present invention may contain a solvent. An example in which the amount of solvent contained in the photosensitive resin layer is in a range of 1% to 10% by mass will be described below.

It is preferable that the photosensitive resin layer used in the present invention is a chemically amplified photosensitive resin layer. In a case where the photosensitive resin layer is of a chemically amplified type, excellent preservation stability and fine pattern formability can be achieved.

The content of the photosensitive resin in the photosensitive resin layer of the present invention is preferably in a range of 20% to 99% by mass, more preferably in a range of 40% to 99% by mass, and still more preferably in a range of 70% to 99% by mass. The photosensitive resin layer may contain one or two or more photosensitive resins.

It is preferable that an exposed portion of the photosensitive resin layer of the present invention is hardly soluble in a developer containing an organic solvent. The expression "hardly soluble" means that the exposed portion is unlikely to be dissolved in the developer. Specifically, the polarity is changed by exposing the exposed portion to light under the condition of 50 mJ/cm$^2$ or greater at a wavelength of 365 nm, and the photosensitive resin layer becomes hardly soluble in a solvent having an sp (solubility parameter) value of preferably less than 19 (MPa)$^{1/2}$, more preferably 18.5 (MPa)$^{1/2}$ or less, and still more preferably 18.0 (MPa)$^{1/2}$ or less. In addition, it is more preferable that the polarity is changed as described above by exposing the photosensitive resin layer to light under the condition of 50 mJ/cm$^2$ to 200 mJ/cm$^2$ at a wavelength of 365 nm.

It is preferable that the photosensitive resin layer used in the present invention is a negative type photosensitive resin layer since a fine trench or a fine hole pattern can be formed.

From the viewpoint of improving the resolution, the thickness of the photosensitive resin layer is preferably 0.1 μm or greater, more preferably 0.5 μm or greater, still more preferably 0.75 μm or greater, and particularly preferably 1.0 μm or greater. The upper limit of the thickness of the photosensitive resin layer is preferably 10 μm or less, more preferably 5.0 μm or less, and still more preferably 2.0 μm or less.

In the present invention, the total thickness of the photosensitive resin layer and the water-soluble resin layer is preferably 0.2 μm or greater, more preferably 1.0 μm or greater, and still more preferably 2.0 μm or greater. The upper limit thereof is preferably 20.0 μm or less, more preferably 10.0 μm or less, and still more preferably 5.0 μm or less. Even in a case where the thickness of the laminate of the present invention is increased as described above, the occurrence of cracks can be effectively suppressed. In recent years, in a step of performing processing on a plurality of organic semiconductors, dry etching is occasionally performed while protecting the plurality of organic semiconductors which are laminated on each other, and the thickness of the photosensitive resin layer or the water-soluble resin layer needs to be three to four times greater than the thickness of the related art in some cases. In the present invention, there is an advantage that the occurrence of cracks can be effectively suppressed even in a case where the thickness of the layer is increased as described above.

The photosensitive resin layer used in the present invention is typically formed using the photosensitive resin composition. It is preferable that the photosensitive resin composition used in the present invention is a chemically amplified photosensitive resin composition containing at least a photosensitive resin and a photoacid generator. In the photosensitive resin composition of the present invention, generation of residues during the development is suppressed and a photosensitive resin layer having a surface with excellent smoothness can be formed.

The photosensitive resin used in the present invention is a resin component constituting the photosensitive resin composition, is typically a resin that includes a repeating unit containing a group dissociated by an acid, and may include other repeating units.

In the present invention, it is preferable that the photosensitive resin is a resin which is soluble in an organic solvent having an sp (solubility parameter) value of 18.0 (MPa)$^{1/2}$ or less and which is hardly soluble in an organic solvent having an sp value of 18.0 (MPa)$^{1/2}$ or less when a tetrahydrothranyl group in a constitutional unit represented by Formula (1) is decomposed or dissociated.

Here, the expression "soluble in an organic solvent having an sp value (solubility parameter value) of 18.0 (MPa)$^{1/2}$ or less" in the present invention means that the dissolution rate of a coating film (thickness: 1 μm) of a compound (resin), in butyl acetate at 23° C., which is formed by coating a substrate with a solution of the compound (resin) and heating the substrate at 100° C. for 1 minute is 20 nm/sec or greater. In addition, the expression "hardly soluble in an organic solvent having an sp value of 1.8.0 (MPa)$^{1/2}$ or less" means that the dissolution rate of a coating film (thickness: 1 μm) of a compound (resin), in butyl acetate at 23° C., which is formed by coating a substrate with a solution of the compound (resin) and heating the substrate at 100° C. for 1 minute is less than 10 nm/sec.

The dissolution rate of the photosensitive resin of the present invention in an inorganic solvent having an sp value of 18.0 $(MPa)^{1/2}$ or less is more preferably 40 nm/sec or greater. Further, in a case where an acid decomposable group of the photosensitive resin is decomposed, the dissolution rate thereof in an inorganic solvent having an sp value of 18.0 $(MPa)^{1/2}$ or less is more preferably less than 1 nm/sec.

It is preferable that the photosensitive resin in the present invention is an acrylic polymer.

The "acrylic polymer" in the present invention is an addition polymerization type resin and is a polymer including a constitutional unit derived from (meth)acrylic acid and/or an ester thereof. Further, the acrylic polymer may include a constitutional unit other than the constitutional unit derived from (meth)acrylic acid and/or an ester thereof, for example, a constitutional unit derived from styrenes or a constitutional unit derived from a vinyl compound.

It is preferable that the photosensitive resin includes 50% by mole or greater of the constitutional unit derived from (meth)acrylic acid and/or an ester thereof, and more preferable that the specific resin A includes 80% by mole or greater of the constitutional unit with respect to the total constitutional units in a polymer, and particularly preferable that the specific resin A is a polymer formed only of the constitutional unit derived from (meth)acrylic acid and/or an ester thereof.

In addition, "the constitutional unit derived from (meth) acrylic acid and/or an ester thereof" is also referred to as an "acrylic constitutional unit." Further, (meth)acrylic acid is a general term for methacrylic acid and acrylic acid.

Constitutional Unit (a1)

The photosensitive resin used in the present invention typically includes a repeating unit containing a group dissociated by an acid. As a preferred example of the group dissociated by an acid, a group which has a cyclic ether ester structure and is represented by Formula (1) is exemplified.

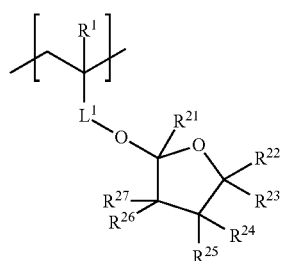

(1)

In Formula (1), $R^1$ represents a hydrogen atom or an alkyl group, $L^1$ represents a carbonyl group or a phenylene group, $R^{21}$ to $R^{27}$ each independently represent a hydrogen atom or an alkyl group.

Next, the constitutional unit represented by Formula (1) (hereinafter, also referred to as a "constitutional unit (a1)" as appropriate) will be described in detail.

Examples of the alkyl group as $R^1$ include a linear, branched, or cyclic alkyl group having 1 to 20 carbon atoms and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Among these alkyl groups, a linear alkyl group having 1 to 12 carbon atoms, a branched alkyl group having 3 to 12 carbon atoms, or a cyclic alkyl group having 5 to 10 carbon atoms is preferable, a linear alkyl group having 1 to 12 carbon atoms is more preferable, and a methyl group or an ethyl group is still more preferable.

It is preferable that $R^1$ represents a hydrogen atom or a methyl group and more preferable that $R^1$ represents a methyl group.

$L^1$ represents a carbonyl group or a phenylene group and it is preferable that $L^1$ represents a carbonyl group.

$R^{21}$ to $R^{27}$ each independently represent a hydrogen atom or an alkyl group. The alkyl group as $R^{21}$ to $R^{27}$ has the same definition as that for $R^1$ and the preferred embodiment is the same as that of $R^1$.

In addition, from viewpoints of decomposition properties and synthesis, it is preferable that one or more of $R^{21}$ to $R^{27}$ represent a hydrogen atom and more preferable that all of $R^{21}$ to $R^{27}$ represent a hydrogen atom.

The constitutional unit represented by Formula (1) in the present invention contains a protected carboxyl group and/or a protected phenolic hydroxyl group.

A carboxylic acid monomer which is capable of forming a unit represented by Formula (1) can be used in a case where the carboxylic acid monomer may become a constitutional unit when the carboxyl group is protected, and examples thereof include acrylic acid and methacrylic acid. In addition, as the constitutional unit, a constitutional unit derived from carboxylic acid in which these carboxylic groups are protected is preferably exemplified.

A monomer including a phenolic hydroxyl group which is capable of forming a constitutional unit represented by Formula (1) can be used in a case where the monomer may become a constitutional unit when a phenolic hydroxyl group is protected. Preferred examples thereof include hydroxystyrenes such as p-hydroxystyrene and α-methyl-p-hydroxystyrene. Among these, α-methyl-p-hydroxystyrene is more preferable.

As a radical polymerizable monomer used to form a constitutional unit (a1), a commercially available product or a product obtained through synthesis using a known method can be used. For example, the radical polymerizable monomer can be synthesized by reacting (meth)acrylic acid with a dihydrofuran compound in the presence of an acid catalyst.

Further, after a carboxyl group to be protected or a phenolic hydroxyl group-containing monomer is polymerized with constitutional units (a2) to (a4) described below or a precursor thereof, the radical polymerizable monomer can be formed by reacting a carboxyl group or a phenolic hydroxyl group with a dihydrofuran compound. In addition, preferred specific examples of constitutional units to be formed in the above-described manner are the same as the constitutional units derived from the preferred specific examples of the radical polymerizable monomer.

As the group dissociated by an acid which is used in the present invention, a repeating unit which includes a group dissociated by an acid, from among compounds described in paragraphs [0039] to [0049] of JP2008-197480A, is preferable, and compounds described in paragraphs [0052] to [0056] of JP2012-159830A (JP5191567B) are preferable. In addition, the contents thereof are incorporated in the specification of the present application.

Particularly preferred examples of the constitutional unit (a1) include the following constitutional units. Among these, (a1-1) and (a1-2) are particularly preferable.

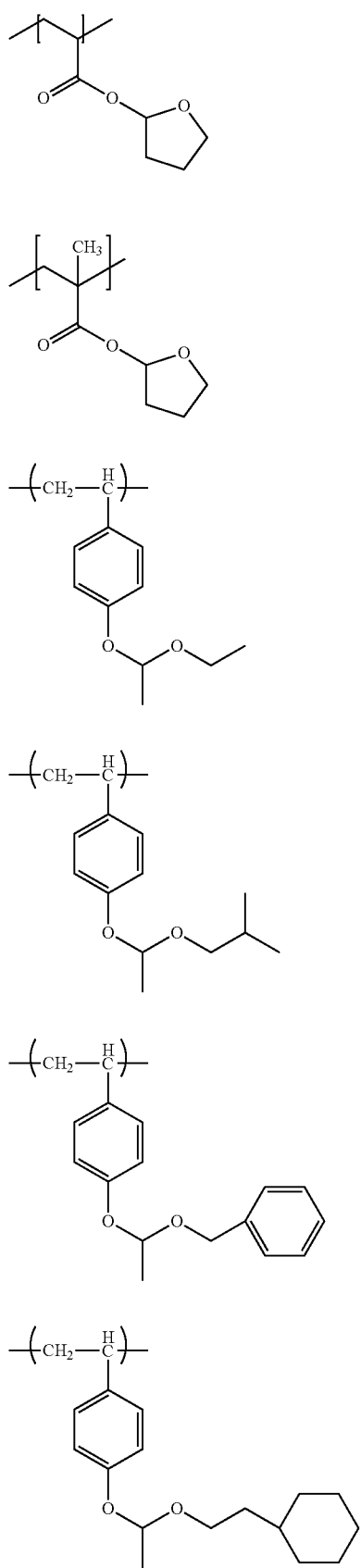

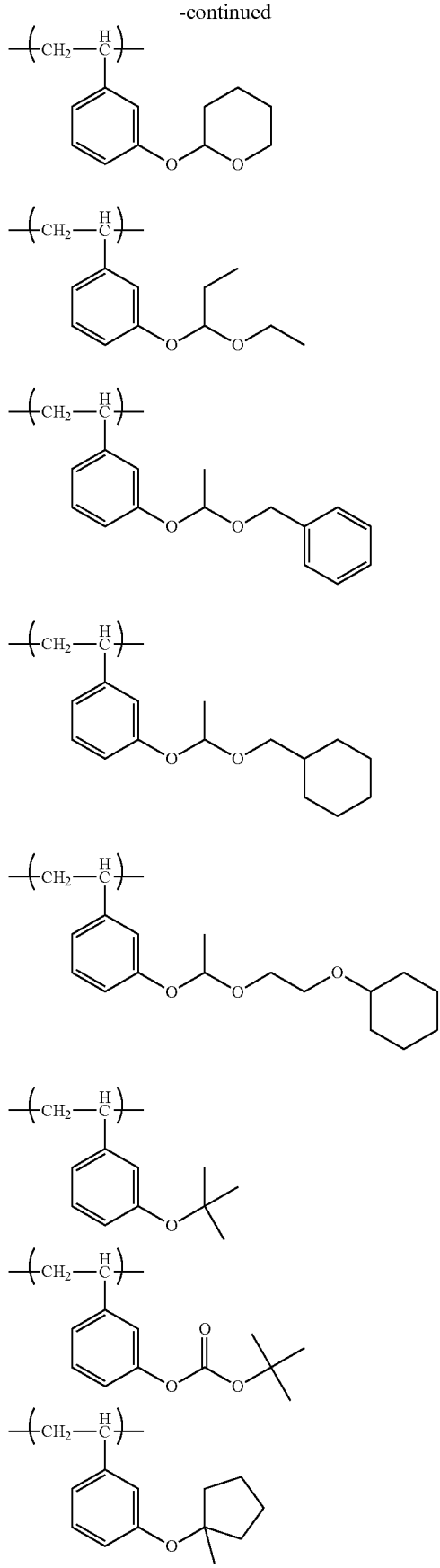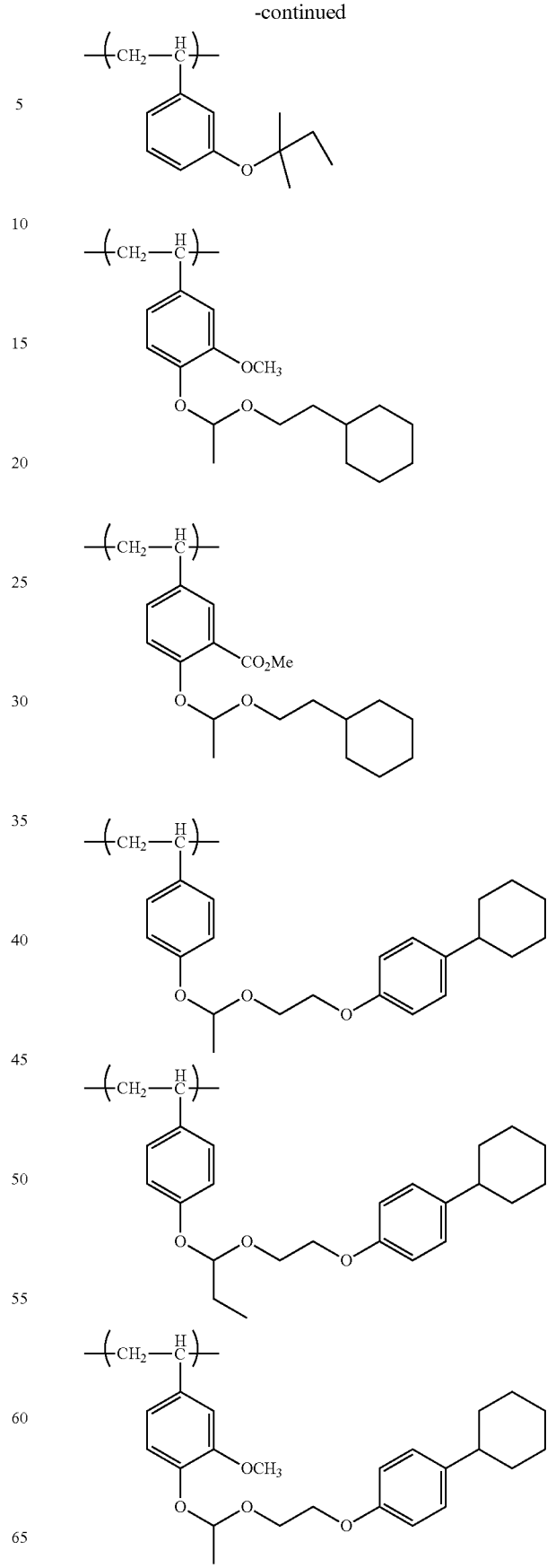

-continued

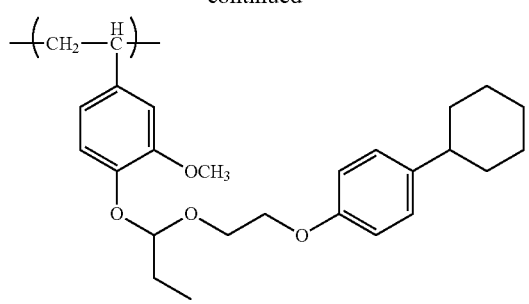

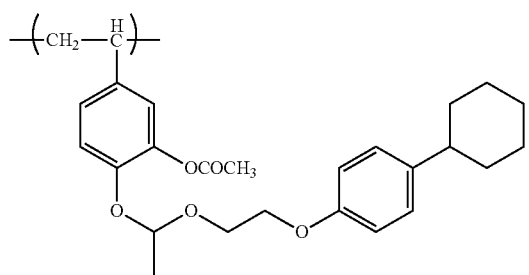

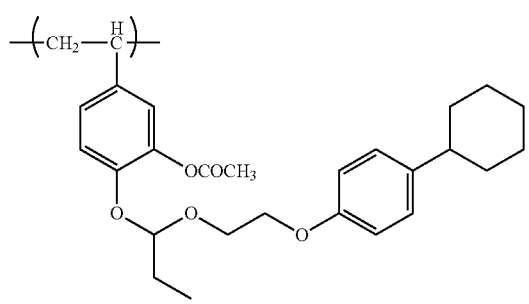

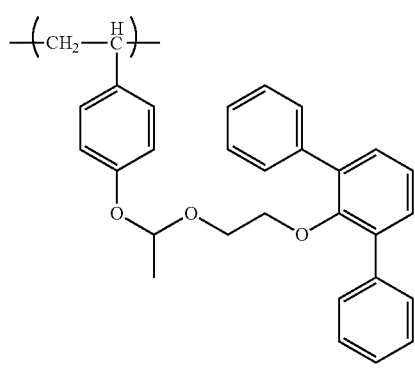

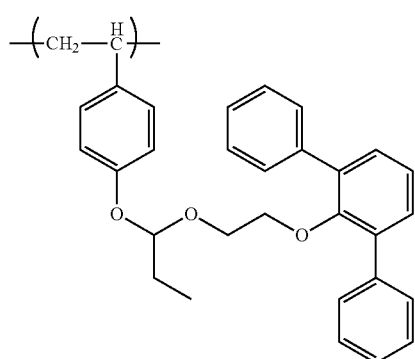

-continued

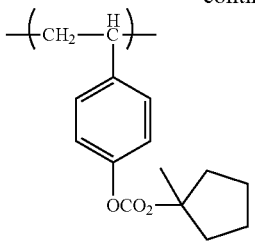

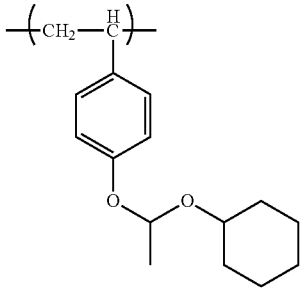

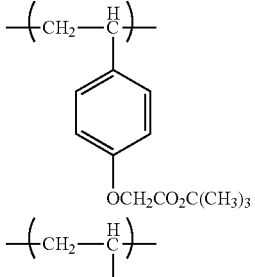

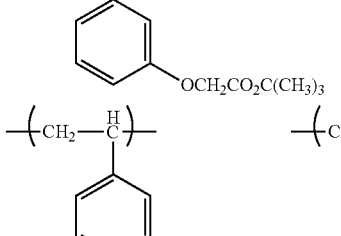

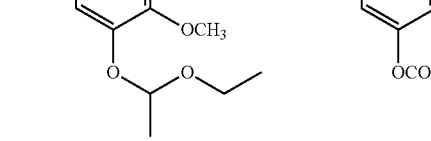

In all monomer units constituting the photosensitive resin, the content of monomer units forming the constitutional unit (a1) is preferably in a range of 5% to 80% by mole, more preferably in a range of 10% to 70% by mole, and still more preferably in a range of 10% to 60% by mole. In a case where the constitutional unit (a1) is contained in the above-described proportion, a photosensitive resin composition which has high sensitivity and a wide exposure latitude can be obtained. The photosensitive resin may contain one or two or more constitutional units (a1).

Constitutional Unit (a3) Having Crosslinking Group

The photosensitive resin of the present invention may include a constitutional unit having a crosslinking group (hereinafter, also referred to as a "constitutional unit (a3) as appropriate). In regard to the details of the crosslinking group, the description in paragraphs [0032] to [0046] of JP2011-209692A can be referred to and the contents thereof are incorporated in the specification of the present application.

As the photosensitive resin used in the present invention, an embodiment which includes the constitutional unit (a3) having a crosslinking group is also preferable, but a configuration in which substantially no constitutional units (a3) having a crosslinking group are contained is preferable. With the above-described configuration, effective removal becomes possible after patterning. Here, the term "substantially" indicates 3% by mole or less and preferably 1% by mole or less with respect to all repeating units of the photosensitive resin.

Other Constitutional Units (a2)

The photosensitive resin may contain other constitutional units (a2) (hereinafter, also referred to as a "constitutional unit (a2)" as appropriate) within the range not disturbing the effects of the present invention.

As a radical polymerizable monomer used to form the constitutional unit (a2), compounds described in paragraphs [0021] to [0024] of JP2004-264623 can be exemplified.

Preferred examples of the constitutional unit (a2) include a constitutional unit derived from at least one selected from the group consisting of hydroxyl group-containing unsaturated carboxylic acid esters, alicyclic structure-containing unsaturated carboxylic acid esters, styrene, and N-substituted maleimide.

Among these, alicyclic structure-containing (meth)acrylic acid esters such as benzyl (meth)acrylate, tricyclo[5.2.1.0$^{2,6}$]decane-8-yl (meth)acrylate, tricyclo[5.2.1.0$^{2,6}$]decane-8-yloxyethyl (meth)acrylate, isobornyl (meth)acrylate, cyclohexyl (meth)acrylate, or 2-methylcyclohexyl (meth)acrylate; and a hydrophobic monomer such as styrene are preferable. From a viewpoint of sensitivity, 2-hydroxyethyl (meth)acrylate and N-substituted maleimide are preferable. Among these, (meth)acrylic acid esters having an alicyclic structure are more preferable. Further, from a viewpoint of ethylene resistance, styrenes such as styrene and α-methylstyrene are preferable.

These constitutional units (a2) can be used alone or in combination of two or more kinds thereof.

In all monomers constituting the photosensitive resin, the content of the monomer units that form the constitutional unit (a2) in a case where the constitutional unit (a2) is contained is preferably 1% to 60% by mole, more preferably in a range of 5% to 50% by mole, and still more preferably in a range of 5% to 40% by mole.

As a synthesis method of the photosensitive resin, various methods have been known. As an example thereof, the photosensitive resin can be synthesized by polymerizing a radical polymerizable monomer mixture containing radical polymerizable monomers used to form at least the constitutional unit (a1) and the constitutional unit (a2) in an organic solvent using a radical polymerization initiator.

In addition, as the photosensitive resin, a copolymer obtained by adding 2,3-dihydrofuran to an acid anhydride group in a precursor copolymer formed by copolymerizing unsaturated polyvalent carboxylic anhydrides in a temperature range of room temperature (25° C.) to 100° C. in the absence of an acid catalyst is preferable.

In the present invention, the following resins are shown as preferred examples of the photosensitive resin.

BzMA/THFMA/t-BuMA (molar ratio: 20 to 60:35 to 65:5 to 30)

BzMA/THFAA/t-BuMA (molar ratio: 20 to 60:35 to 65:5 to 30)

BzMA/THPMA/t-BuMA (molar ratio: 20 to 60:35 to 65:5 to 30)

BzMA/PEES/t-BuMA (molar ratio: 20 to 60:35 to 65:5 to 30)

BzMA is an abbreviation of benzyl methacrylate; THFMA is an abbreviation of tetrahydrofuran-2-yl methacrylate; BuMA is an abbreviation of butyl methacrylate; THFAA is an abbreviation of tetrahydrofuran-2-yl acrylate; THPMA is an abbreviation of tetrahydro-2H-pyran-2-yl methacrylate; and PEES is an abbreviation of p-ethoxyethoxystyrene.

The content of the photosensitive resin in the photosensitive resin composition of the present invention is preferably in a range of 20% to 99% by mass, more preferably in a range of 40% to 99% by mass, and still more preferably in a range of 70% to 99% by mass with respect to total solid contents of the photosensitive resin composition. In a case where the content thereof is in the above-described range, pattern formability at the time of development becomes excellent. The photosensitive resin composition may contain only one or two or more photosensitive resins.

Photoacid Generator

The photosensitive resin composition of the present invention contains a photoacid generator. It is preferable that the photoacid generator of the present invention is decomposed by 80% by mole or greater when exposed to light under the condition of 100 mJ/cm² or greater at a wavelength of 365 nm.

The degree of decomposition of the photoacid generator can be acquired according to the following method.

A chemically amplified photosensitive resin composition having a film thickness of 700 nm is formed on a silicon wafer, the wafer is heated at 100° C. for 1 minute and exposed to light under the condition of 100 mJ/cm² at a wavelength of 365 nm, and the substrate heated at 100° C. for 1 minute is immersed in a solution, in which the mixing ratio between methanol and THF is 50:50, for 10 minutes while ultrasonic waves are applied to the solution. The decomposition rate of the photoacid generator can be calculated according to the following equation by analyzing an extract with high performance liquid chromatography (HPLC).

Decomposition rate (%)=Amount of decomposition product (mol)/Feed amount (mol)×100

It is preferable that the photoacid generator used in the present invention is decomposed by 85% by mole or greater when exposed to light under the condition of 100 to 200 mJ/cm² at a wavelength of 365 nm.

It is preferable that the photoacid generator used in the present invention is a compound containing an oxime sulfonate group (hereinafter, also simply referred to as an oxime sulfonate compound).

The oxime sulfonate compound is not particularly limited as long as the compound includes an oxime sulfonate group, and it is preferable that the oxime sulfonate compound is an oxime sulfonate compound represented by Formula (2), or (OS-103), (OS-104), or (OS-105) shown below.

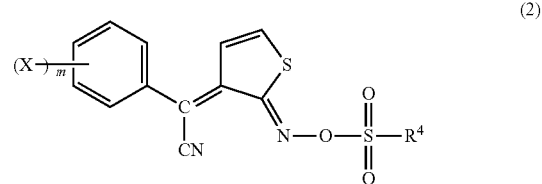

X's in Formula (2) each independently represent an alkyl group, an alkoxy group, or a halogen atom.

The alkyl group and the alkoxy group as X may include a substituent. As the alkyl group as X described above, a linear or branched alkyl group having 1 to 4 carbon atoms is preferable. As the alkoxy group as X described above, a linear or branched alkoxy group having 1 to 4 carbon atoms is preferable. As the halogen atom as X, a chlorine atom or a fluorine atom is preferable.

m in Formula (2) represents an integer of 0 to 3, and 0 or 1 is preferable. When m represents 2 or 3, a plurality of X's may be the same as or different from each other.

$R^4$ in Formula (2) represents an alkyl group or an aryl group. It is preferable that $R^4$ represents an alkyl group having 1 to 10 carbon atoms, an alkoxy group having 1 to 10 carbon atoms, a halogenated alkyl group having 1 to 5 carbon atoms, a halogenated alkoxy group having 1 to 5 carbon atoms, a phenyl group which may be substituted with W, a naphthyl group which may be substituted with W, or an anthranyl group which may be substituted with W. W represents a halogen atom, a cyano group, a nitro group, an alkyl group having 1 to 10 carbon atoms, an alkoxy group having 1 to 10 carbon atoms, a halogenated alkyl group having 1 to 5 carbon atoms, or a halogenated alkoxy group having 1 to 5 carbon atoms.

Specific examples of the alkyl group having 1 to 10 carbon atoms as $R^4$ include a methyl group, an ethyl group, an n-propyl group, an i-propyl group, an n-butyl group, an i-butyl group, an s-butyl group, a t-butyl group, an n-amyl group, an i-amyl group, an s-amyl group, an n-hexyl group, an n-heptyl group, an n-octyl group, an n-nonyl group, and an n-decyl group.

Specific examples of the alkoxy group having 1 to 10 carbon atoms as $R^4$ include a methoxy group, an ethoxy group, an n-propoxy group, an i-propoxy group, an n-butoxy group, an n-amyloxy group, an n-octyloxy group, and an n-decyloxy group.

Specific examples of the halogenated alkyl group having 1 to 5 carbon atoms as $R^4$ include a trifluoromethyl group, a pentylfluoroethyl group, a perfluoro-n-propyl group, a perfluoro-n-butyl group, and a perfluoro-n-amyl group.

Specific examples of the halogenated alkoxy group having 1 to 5 carbon atoms as $R^4$ include a trifluoromethoxy group, a pentafluoroethoxy group, a perfluoro-n-propoxy group, a perfluoro-n-butoxy group, and a perfluoro-n-amyloxy group.

Specific examples of the phenyl group which can be substituted with W as $R^4$ include an o-tolyl group, an m-tolyl group, a p-tolyl group, an o-ethylphenyl group, an m-ethylphenyl group, a p-ethylphenyl group, a p-(n-propyl)phenyl group, a p-(i-propyl)phenyl group, a p-(n-butyl)phenyl group, a p-(i-butyl)phenyl group, a p-(s-butyl)phenyl group, a p-(t-butyl)phenyl group, a p-(n-amyl)phenyl group, a p-(i-amyl)phenyl group, a p-(t-amyl)phenyl group, an o-methoxyphenyl group, an m-methoxyphenyl group, a p-methoxyphenyl group, an o-ethoxyphenyl group, an m-ethoxyphenyl group, a p-ethoxyphenyl group, a p-(n-propoxy)phenyl group, a p-(i-propoxy)phenyl group, a p-(n-butoxy)phenyl group, a p-(i-butoxy)phenyl group, a p-(s-butoxy)phenyl group, a p-(t-butoxy)phenyl group, a p-(n-amyloxy)phenyl group, a p-(i-amyloxy)phenyl group, a p-(t-amyloxy)phenyl group, a p-chlorophenyl group, a p-bromophenyl group, a p-fluorophenyl group, a 2,4-dichlorophenyl group, a 2,4-dibromophenyl group, a 2,4-difluorophenyl group, a 2,4,6-trichlorophenyl group, a 2,4,6-tribromophenyl group, a 2,4,6-trifluorophenyl group, a pentachlorophenyl group, a pentabromophenyl group, a pentafluorophenyl group, and a p-biphenylyl group.

Specific examples of the naphthyl group which can be substituted with W as $R^4$ include a 2-methyl-1-naphthyl group, a 3-methyl-1-naphthyl group, a 4-methyl-1-naphthyl group, a 5-methyl-1-naphthyl group, a 6-methyl-1-naphthyl group, a 7-methyl-1-naphthyl group, an 8-methyl-1-naphthyl group, a 1-methyl-2-naphthyl group, a 3-methyl-2-naphthyl group, a 4-methyl-2-naphthyl group, a 5-methyl-2-naphthyl group, a 6-methyl-2-naphthyl group, a 7-methyl-2-naphthyl group, and an 8-methyl-2-naphthyl group.

Specific examples of the anthranyl group which can be substituted with W as $R^4$ include a 2-methyl-1-anthranyl group, a 3-methyl-1-anthranyl group, a 4-methyl-1-anthranyl group, a 5-methyl-1-anthranyl group, a 6-methyl-1-anthranyl group, a 7-methyl-1-anthranyl group, an 8-methyl-1-anthranyl group, a 9-methyl-1-anthranyl group, a 10-methyl-1-anthranyl group, a 1-methyl-2-anthranyl group, a 3-methyl-2-anthranyl group, a 4-methyl-2-anthranyl group, a 5-methyl-2-anthranyl group, a 6-methyl-2-anthranyl group, a 7-methyl-2-anthranyl group, an 8-methyl-2-anthranyl group, a 9-methyl-2-anthranyl group, and a 10-methyl-2-anthranyl group.

In Formula (2), a compound in which m represents 1, X represents a methyl group, a substitution position of X is an ortho-position, and $R^4$ represents a linear alkyl group having 1 to 10 carbon atoms, a 7,7-dimethyl-2-orthonorbornylmethyl group, or a p-toluyl group is particularly preferable.

Specific examples of the oxime sulfonate compound represented by Formula (2) include the following compounds described in paragraphs [0064] to [0068] of JP2011-209692A, and the contents thereof are incorporated in the present specification.

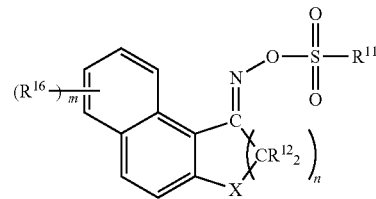

(OS-103)

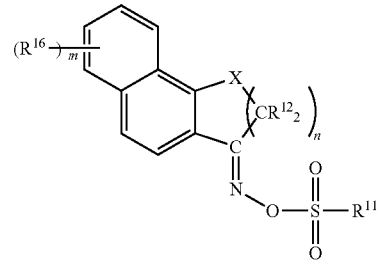

(OS-104)

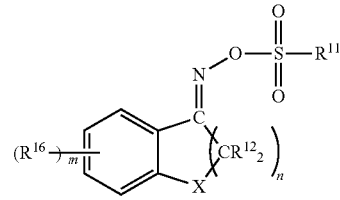

(OS-105)

(In Formulae (OS-103) to (OS-105), $R^{11}$ represents an alkyl group, an aryl group, or a heteroaryl group; a plurality of $R^{12}$'s each independently represent a hydrogen atom, an alkyl group, an aryl group, or a halogen atom; a plurality of $R^{16}$'s each independently represent a halogen atom, an alkyl group, an alkyloxy group, a sulfonic acid group, an aminosulfonyl group, or an alkoxysulfonyl group; X represents O or S; n represents 1 or 2; and m represents an integer of 0 to 6.)

In Formula (OS-103) to (OS-105), the alkyl group, the aryl group, or the heteroaryl group represented by $R^{11}$ may include a substituent.

In Formulae (OS-103) to (OS-105), it is preferable that the alkyl group represented by $R^{11}$ is an alkyl group which may include a substituent and has 1 to 30 carbon atoms.

Examples of the substituent which may be included in the alkyl group represented by $R^{11}$ include a halogen atom, an alkyloxy group, an aryloxy group, an alkylthio group, an arylthio group, an alkyloxycarbonyl group, an aryloxycarbonyl group, and an aminocarbonyl group.

In Formulae (OS-103) to (OS-105), examples of the alkyl group represented by $R^{11}$ include a methyl group, an ethyl group, an n-propyl group, an i-propyl group, an n-butyl group, an s-butyl group, a t-butyl group, an n-pentyl group, an n-hexyl group, an n-octyl group, an n-decyl group, an n-dodecyl group, a trifluoromethyl group, a perfluoropropyl group, a perfluorohexyl group, and a benzyl group.

In Formulae (OS-103) to (OS-105), as the aryl group represented by $R^{11}$, an aryl group which may include a substituent and has 6 to 30 carbon atoms is preferable.

Examples of the substituent which may be included in the aryl group represented by $R^{11}$ include a halogen atom, an alkyl group, an alkyloxy group, an aryloxy group, an alkylthio group, an arylthio group, an alkyloxycarbonyl group, an aryloxycarbonyl group, an aminocarbonyl group, a sulfonic acid group, an aminosulfonyl group, and an alkoxysulfonyl group.

As the aryl group represented by $R^{11}$, a phenyl group, a p-methylphenyl group, a p-chlorophenyl group, a pentachlorophenyl group, a pentafluorophenyl group, an o-methoxyphenyl group, or a p-phenoxyphenyl group is preferable.

In Formulae (OS-103) to (OS-105), as the heteroaryl group represented by $R^{11}$, a heteroaryl group which may include a substituent and has 4 to 30 carbon atoms is preferable.

Examples of the substituent which may be included in the heteroaryl group represented by $R^{11}$ include a halogen atom, an alkyl group, an alkyloxy group, an aryloxy group, an alkylthio group, an arylthio group, an alkyloxycarbonyl group, an aryloxycarbonyl group, an aminocarbonyl group, a sulfonic acid group, an aminosulfonyl group, and an alkoxysulfonyl group.

In Formulae (OS-103) to (OS-105), the heteroaryl group represented by $R^{11}$ may include at least one heteroaromatic ring and, for example, a heteroaromatic ring and a benzene ring may be condensed.

The heteroaryl group represented by $R^{11}$ may include a substituent. A group obtained by removing one hydrogen atom from a ring selected from the group consisting of a thiophene ring, a pyrrole ring, a thiazole ring, an imidazole ring, a furan ring, a benzothiophene ring, a benzothiazole ring, and a benzimidazole ring is exemplified.

In Formulae (OS-103) to (OS-105), it is preferable that $R^{12}$ represents a hydrogen atom, an alkyl group, or an aryl group and more preferable that $R^{12}$ represents a hydrogen atom or an alkyl group.

In Formulae (OS-103) to (OS-105), among two or more $R^{12}$'s existing in a compound, it is preferable that one or two $R^{12}$'s represent an alkyl group, an aryl group, or a halogen atom, more preferable that one $R^{12}$ represents an alkyl group, an aryl group, or a halogen atom, and particularly preferable that one $R^{12}$ represents an alkyl group and the rest represent a hydrogen atom.

In Formulae (OS-103) to (OS-105), the alkyl group or the aryl group represented by $R^{12}$ may include a substituent.

Examples of the substituent which may be included in the alkyl group or the aryl group represented by $R^{12}$ are the same as those of the substituent which may be included in the alkyl group or the aryl group represented by $R^1$.

In Formulae (OS-103) to (OS-105), as the alkyl group represented by $R^{12}$, an alkyl group which may include a substituent and has 1 to 12 carbon atoms is preferable and an alkyl group which may include a substituent and has 1 to 6 carbon atoms is more preferable.

As the alkyl group represented by $R^{12}$, a methyl group, an ethyl group, an n-propyl group, an i-propyl group, an n-butyl group, an i-butyl group, an s-butyl group, an n-hexyl group, an allyl group, a chloromethyl group, a bromomethyl group, a methoxymethyl group, or a benzyl group is preferable; a methyl group, an ethyl group, an n-propyl group, an i-propyl group, an n-butyl group, an i-butyl group, an s-butyl group, or an n-hexyl group is more preferable; a methyl group, an ethyl group, an n-propyl group, an n-butyl group, or an n-hexyl group is still more preferable; and a methyl group is particularly preferable.

In Formulae (OS-103) to (OS-105), as the aryl group represented by $R^{12}$, an aryl group which may include a substituent and has 6 to 30 carbon atoms is preferable.

Preferred examples of the aryl group represented by $R^{12}$ include a phenyl group, a p-methylphenyl group, an o-chlorophenyl group, a p-chlorophenyl group, an o-methoxyphenyl group, and a p-phenoxyphenyl group.

Examples of the halogen atom represented by $R^{12}$ include a fluorine atom, a chlorine atom, a bromine atom, and iodine atom. Among these, a chlorine atom or a bromine atom is preferable.

In Formulae (OS-103) to (OS-105), X represents O or S, and it is preferable that X represents O. In Formulae (OS-103) to (OS-105), a ring containing X as a ring member is a 5- or 6-membered ring.

In Formulae (OS-103) to (OS-105), n represents 1 or 2. It is preferable that n represents 1 when X represents O and it is preferable that n represents 2 when X represents S.

In Formulae (OS-103) to (OS-105), the alkyl group and the alkyloxy group represented by $R^{16}$ may include a substituent.

In Formulae (OS-103) to (OS-105), as the alkyl group represented by $R^{16}$, an alkyl group which may include a substituent and has 1 to 30 carbon atoms is preferable.

Examples of the substituent which may be included in the alkyl group represented by $R^{16}$ include a halogen atom, an alkyloxy group, an aryloxy group, an alkylthio group, an arylthio group, an alkyloxycarbonyl group, an aryloxycarbonyl group, and an aminocarbonyl group.

In Formulae (OS-103) to (OS-105), preferred examples of the alkyl group represented by $R^{16}$ include a methyl group, an ethyl group, an n-propyl group, an i-propyl group, an n-butyl group, an s-butyl group, a t-butyl group, an n-pentyl group, an n-hexyl group, an n-octyl group, an n-decyl group, an n-dodecyl group, a trifluoromethyl group, a perfluoropropyl group, a perfluorohexyl group, and a benzyl group.

In Formulae (OS-103) to (OS-105), as the alkyloxy group represented by $R^{16}$, an alkyloxy group which may include a substituent and has 1 to 30 carbon atoms is preferable.

Examples of the substituent which may be included in the alkyloxy group represented by $R^{16}$ include a halogen atom, an alkyloxy group, an aryloxy group, an alkylthio group, an arylthio group, an alkyloxycarbonyl group, an aryloxycarbonyl group, and an aminocarbonyl group.

In Formulae (OS-103) to (OS-105), as the alkyloxy group represented by $R^{16}$, a methyloxy group, an ethyloxy group, a butyloxy group, a hexyloxy group, a phenoxyethyloxy group, a trichloromethyloxy group, or an ethoxyethyloxy group is preferable.

Examples of the aminosulfonyl group as $R^{16}$ include a methylaminosulfonyl group, a dimethylaminosulfonyl group, a phenylaminosulfonyl group, a methylphenylaminosulfonyl group, and an aminosulfonyl group.

Examples of the alkoxysulfonyl group represented by $R^{16}$ include a methoxysulfonyl group, an ethoxysulfonyl group, a propyloxysulfonyl group, and a butyloxysulfonyl group.

Moreover, in Formulae (OS-103) to (OS-105), m represents an integer of 0 to 6, preferably represents an integer of 0 to 2, more preferably represents 0 or 1, and particularly preferably represents 0.

In addition, it is particularly preferable that the compound represented by Formula (OS-103) is a compound represented by Formula (OS-106), (OS-110), or (OS-111), particularly preferable that the compound represented by Formula (OS-104) is a compound represented by Formula (OS-107), and particularly preferable that the compound represented by Formula (OS-105) is a compound represented by Formula (OS-108) or (OS-109).

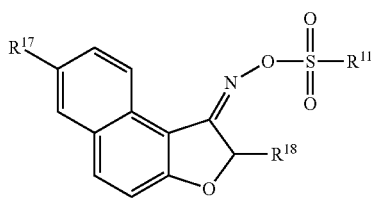
(OS-106)

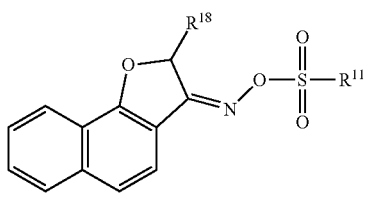
(OS-107)

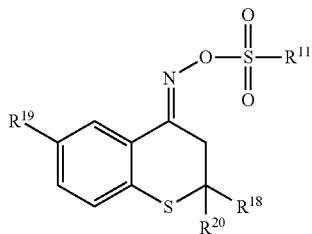
(OS-108)

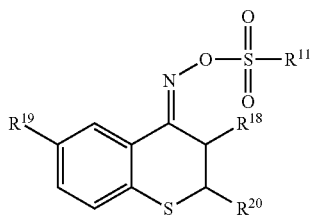
(OS-109)

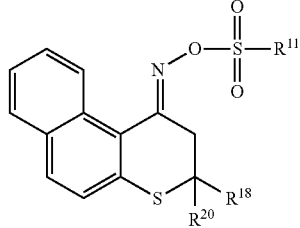
(OS-110)

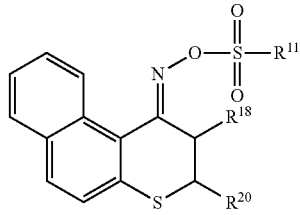
(OS-111)

(In Formulae (OS-106) to (OS-111), $R^{11}$ represents an alkyl group, an aryl group, or a heteroaryl group; $R^{17}$ represents a hydrogen atom or a bromine atom; $R^{18}$ represents a hydrogen atom, an alkyl group having 1 to 8 carbon atoms, a halogen atom, a chloromethyl group, a bromomethyl group, a bromoethyl group, a methoxymethyl group, a phenyl group, or a chlorophenyl group; $R^{19}$ represents a hydrogen atom, a halogen atom, a methyl group, or a methoxy group, and $R^{20}$ represents a hydrogen atom or a methyl group.)

$R^{11}$ in Formulae (OS-106) to (OS-111) has the same definition as that for $R^{11}$ in Formulae (OS-103) to (OS-105) and preferred embodiments are the same as each other.

$R^{17}$ in Formula (OS-106) represents a hydrogen atom or a bromine atom and preferably represents a hydrogen atom.

$R^{18}$ in Formulae (OS-106) to (OS-111) represents a hydrogen atom, an alkyl group having 1 to 8 carbon atoms, a halogen atom, a chloromethyl group, a bromomethyl group, a bromoethyl group, a methoxymethyl group, a phenyl group, or a chlorophenyl group, preferably represents an alkyl group having 1 to 8 carbon atoms, a halogen atom, or a phenyl group, more preferably represents an alkyl group having 1 to 8 carbon atoms, still more preferably represents an alkyl group having 1 to 6 carbon atoms, and particularly preferably represents a methyl group.

$R^{19}$ in Formulae (OS-108) and (OS-109) represents a hydrogen atom, a halogen atom, a methyl group, or a methoxy group and preferably represents a hydrogen atom.

$R^{20}$ in Formulae (OS-108) to (OS-111) represents a hydrogen atom or a methyl group and preferably represents a hydrogen atom.

Moreover, the above-described oxime sulfonate compound may have one or a mixture of oxime steric structures (E, Z).

Specific examples of the oxime sulfonate compounds represented by Formula (OS-103) to (OS-105) include the following compounds described in paragraphs [0088] to [0095] of JP2011-209692A, and the contents thereof are incorporated in the present specification.

As another preferred embodiment of an oxime sulfonate compound which includes at least one oxime sulfonate group, a compound represented by Formula (OS-101) is exemplified.

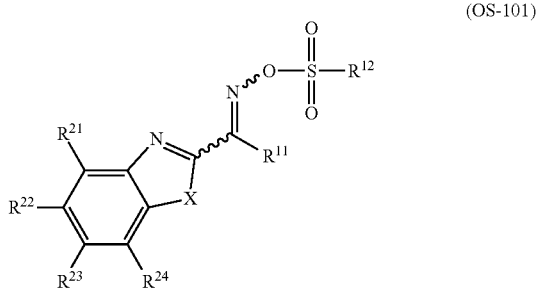

(OS-101)

In Formula (OS-101), $R^{11}$ represents a hydrogen atom, an alkyl group, an alkenyl group, an alkoxy group, an alkoxycarbonyl group, an acyl group, a carbamoyl group, a sulfamoyl group, a sulfo group, a cyano group, an aryl group, or a heteroaryl group. $R^{12}$ represents an alkyl group or an aryl group.

X represents —O—, —S—, —NH—, —NR$^{15}$—, —CH$_2$—, —CR$^{16}$H—, or —CR$^{16}$R$^{17}$—, and $R^{15}$ to $R^{17}$ each independently represent an alkyl group or an aryl group.

$R^{21}$ to $R^{24}$ each independently represent a hydrogen atom, a halogen atom, an alkyl group, an alkenyl group, an alkoxy group, an amino group, an alkoxycarbonyl group, an alkylcarbonyl group, an arylcarbonyl group, an amide group, a sulfo group, a cyano group, or an aryl group. Two of $R^{21}$ to $R^{24}$ may be bonded to each other to form a ring.

As $R^{21}$ to $R^{24}$, a hydrogen atom, a halogen atom, or an alkyl group is preferable and an embodiment in which at least two of $R^{21}$ to $R^{24}$ are bonded to each other to form an aryl group is preferably exemplified. Among these, from the viewpoint of sensitivity, an embodiment in which all of $R^{21}$ to $R^{24}$ represent a hydrogen atom is preferable.

Any of the above-described substituents may further include a substituent.

It is more preferable that the compound represented by Formula (OS-101) above is a compound represented by Formula (OS-102).

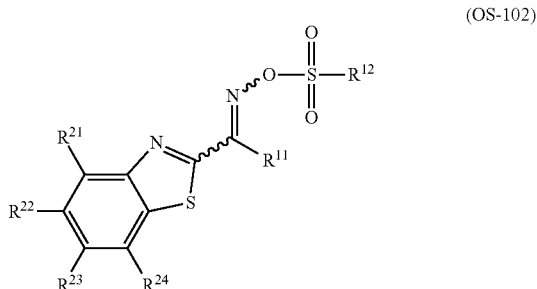

(OS-102)

In Formula (OS 102) $R^{11}$, $R^{12}$, and $R^{21}$ to $R^{24}$ respectively have the same definitions as those for $R^{11}$, $R^{12}$, and $R^{21}$ to $R^{24}$ in Formula (OS-101), and preferred examples are the same as each other.

Among these, an embodiment in which $R^{11}$ in Formulae (OS-101) and (OS-102) represents a cyano group or an aryl group is more preferable and an embodiment which is represented by Formula (OS-102) and $R^{11}$ represents a cyano group, a phenyl group, or a naphthyl group is still more preferable.

Moreover, the above-described oxime sulfonate compound may have one or a mixture of steric structures (E, Z, and the like) of oxime and a benzothiazole ring.

Specific examples of the compound represented by Formula (OS-101) include the following compounds described in paragraphs [0102] to [0106] of JP2011-209692A, and the contents thereof are incorporated in the present specification.

Among the above-described compounds, from the viewpoint of compatibility of sensitivity and stability, compounds b-9, b-16, b-31, and b-33 are preferable.

Examples of commercially available products thereof include WPAG-336 (manufactured by Wako Pure Chemical Industries, Ltd.), WPAG-443 (manufactured by Wako Pure Chemical Industries, Ltd.), and MBZ-101 (manufactured by Midori Kagan Co., Ltd.).

It is preferable that the photosensitive resin composition of the present invention does not contain a 1,2-quinonediazide compound as a photoacid generator that responds to active rays. The reason for this is that the 1,2-quinonediazide compound generates a carboxyl group using a sequential photochemical reaction, but the quantum yield is 1 or less and thus the sensitivity is lower than that of an oxime sulfonate compound.

On the contrary, it is assumed that, since the oxime sulfonate compound acts as a catalyst with respect to deprotection of an acid group in which an acid generated by the compound responding to active rays is protected, an acid generated due to an action of one light quantum contributes to several times of the deprotection reaction, the quantum yield exceeds 1 and becomes a large value, for example, a multiple of 10, and then high sensitivity is obtained as a result of so-called chemical amplification.

Further, since the oxime sulfonate compound has a π conjugated system which is extended, the compound has absorption on a long wavelength side and extremely high sensitivity is shown with respect to not only deep ultraviolet (DU V) and i-line but also g-line. Particularly, in a case where the total thickness of two layers of a negative type photosensitive resin layer having a sensitivity with respect to i-line and a water-soluble resin layer exceeds 1 μm, cracks are likely to occur. However, in the present invention, excellent dry etching resistance can be realized without the occurrence of cracks even in a case of such a laminate.

In the photosensitive resin composition of the present invention, acid decomposition properties greater than or equal to those of acetal or ketal can be obtained using a tetrahydrofuranyl group as an acid decomposable group in the photosensitive resin. In this manner, the acid decomposable group can be reliably consumed through post-baking over a shorter period of time. In addition, since the sulfonic acid generation rate is increased by using a combination of an oxime sulfonate compound serving as a photoacid generator, generation of an acid is promoted and decomposition of an acid decomposable group of a resin is promoted. Further, since an acid obtained through decomposition of the oxime sulfonate compound is a sulfonic acid with small molecules, the diffusibility in a cured film is high and thus the sensitivity can be increased.

The photoacid generator may be used alone or in combination of two or more kinds thereof.

In the photosensitive resin composition of the present invention, the content of the photoacid generator to be used is preferably in a range of 0.1% to 20% by mass and more preferably in a range of 0.5% to 18% by mass with respect to the total solid contents of the photosensitive resin composition.

Other Components

The photosensitive resin composition of the present invention may contain other components.

From the viewpoint of the coating properties, it is preferable that the photosensitive resin composition contains an organic solvent as other components.

Organic Solvent

It is preferable that the photosensitive resin composition of the present invention contains an organic solvent.

In the photosensitive resin composition of the present invention, it is preferable that a photoacid generator and arbitrary components of various additives in addition to the photosensitive resin are dissolved in the organic solvent to prepare a solution.

A known organic solvent can be used as the organic solvent to be used for the photosensitive resin composition of the present invention, and examples thereof include ethylene glycol monoalkyl ethers, ethylene glycol dialkyl ethers, ethylene glycol monoalkyl ether acetates, propylene glycol monoalkyl ethers, propylene glycol dialkyl ethers, propylene glycol monoalkyl ether acetates, diethylene glycol dialkyl ethers, diethylene glycol monoalkyl ether acetates, dipropylene glycol monoalkyl ethers, dipropylene glycol dialkyl ethers, dipropylene glycol monoalkyl ether acetates, esters, ketones, amides, and lactones.

Examples of the organic solvent to be used for the photosensitive resin composition of the present invention include (1) ethylene glycol monoalkyl ethers such as ethylene glycol monomethyl ether, ethylene glycol monoethyl ether, ethylene glycol monopropyl ether, and ethylene glycol monobutyl ether; (2) ethylene glycol dialkyl ethers such as ethylene glycol dimethyl ether, ethylene glycol diethyl ether, and ethylene glycol dipropyl ether; (3) ethylene glycol monoalkyl ether acetates such as ethylene glycol monomethyl ether acetate, ethylene glycol monoethyl ether acetate, ethylene glycol monopropyl ether acetate, and ethylene glycol monobutyl ether acetate; (4) propylene glycol monoalkyl ethers such as propylene glycol trionomethyl ether, propylene glycol monoethyl ether, propylene glycol monopropyl ether, and propylene glycol monobutyl ether; (5) propylene glycol dialkyl ethers such as propylene glycol dimethyl ether and propylene glycol diethyl ether.

(6) propylene glycol monoalkyl ether acetates such as propylene glycol monomethyl ether acetate, propylene glycol monoethyl ether acetate, propylene glycol monopropyl ether acetate, and propylene glycol monobutyl ether acetate; (7) diethylene glycol dialkyl ethers such as diethylene glycol dimethyl ether, diethylene glycol diethyl ether, and diethylene glycol ethyl methyl ether; (8) diethylene glycol monoalkyl ether acetates such as diethylene glycol monomethyl ether acetate, diethylene glycol monoethyl ether acetate, diethylene glycol monopropyl ether acetate, and diethylene glycol monobutyl ether acetate; (9) dipropylene glycol monoalkyl ethers such as dipropylene glycol monomethyl ether, dipropylene glycol monoethyl ether, dipropylene glycol monopropyl ether, and dipropylene glycol monobutyl ether; (10) dipropylene glycol dialkyl ethers such as dipropylene glycol dimethyl ether, dipropylene glycol diethyl ether, and dipropylene glycol ethyl methyl ether.

(11) dipropylene glycol monoalkyl ether acetates such as dipropylene glycol monomethyl ether acetate, dipropylene glycol monoethyl ether acetate, dipropylene glycol monopropyl ether acetate, and dipropylene glycol monobutyl ether acetate; (12) lactates such as methyl lactate, ethyl lactate, n-propyl lactate, isopropyl lactate, n-butyl lactate, isobutyl lactate, n-amyl lactate, and isoamyl lactate; (13) aliphatic carboxylates such as n-butyl acetate, isobutyl acetate, n-amyl acetate, isoamyl acetate, n-hexyl acetate, 2-ethylhexyl acetate, ethyl propionate, n-propyl propionate, isopropyl propionate, n-butyl propionate, isobutyl propionate, methyl butyrate, ethyl butyrate, ethyl butyrate, n-propyl butyrate, isopropyl butyrate, n-butyl butyrate, and isobutyl butyrate; (14) esters such as ethyl hydroxyacetate, ethyl 2-hydroxy-2-methylpropionate, ethyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methoxy butyl acetate, 3-methyl-3-methoxy butyl acetate, 3-methyl-3-methoxy butyl propionate, 3-methyl-3-methoxy butyl butyrate, methyl acetoacetate, ethyl acetoacetate, methyl pyruvate, and ethyl pyruvate.

(15) ketones such as methyl ethyl ketone, methyl propyl ketone, methyl-n-butyl ketone, methyl isobutyl ketone, 2-heptanone, 3-heptanone, 4-heptanone, and cyclohexanone; (16) amides such as N-methylformamide, N,N-dimethylformamide, N-methylacetamide, N,N-dimethylacetamide, and N-methylpyrrolidone; and (17) lactones such as γ-butyrolactone.

Moreover, in addition to these organic solvents, organic solvents such as benzyl ethyl ether, dihexyl ether, ethylene glycol monophenyl ether acetate, diethylene glycol monomethyl ether, diethylene glycol monoethyl ether, isophorone, caproic acid, caprylic acid, 1-octanol, 1-nonanol, benzyl alcohol, anisole, benzyl acetate, ethyl benzoate, diethyl oxalate, diethyl maleate, or ethylene carbonate, and propylene carbonate can be added as necessary.

Among the above-described organic solvents, propylene glycol monoalkyl ether acetates and/or diethylene glycol dialkyl ethers are preferable, and diethylene glycol ethyl methyl ether and/or propylene glycol monomethyl ether acetate are particularly preferable.

These organic solvents can be used alone or in combination of two or more kinds thereof.

In a case where the photosensitive resin composition of the present invention contains an organic solvent, the content of the organic solvent is preferably in a range of 1 to 3000 parts by mass, more preferably in a range of 5 to 2000 parts by mass, and still more preferably in a range of 10 to 1500 parts by mass with respect to 100 parts by mass of the photosensitive resin.

Further, it is preferable that the photosensitive resin composition of the present invention contains a basic compound from the viewpoint of liquid preservation stability and contains a surfactant from the viewpoint of coating properties.

Basic Compound

It is preferable that the photosensitive resin composition of the present invention contains a basic compound.

A basic compound can be arbitrarily selected from compounds used for chemically amplified resists and then used. Examples thereof include aliphatic amines, aromatic amines, heterocyclic amines, quaternary ammonium hydroxide, and quaternary ammonium salts of carboxylic acids.

Examples of the aliphatic amine include trimethylamine, diethylamine, trimethylamine, di-n-propylamine, tri-n-propylamine, di-n-pentylamine, tri-n-pentylamine, diethanolamine, triethanolamine, dicyclohexylamine, and dicyclohexylmethylamine.

Examples of the aromatic amine include aniline, benzylamine, N,N-dimethylaniline, and diphenylamine.

Examples of the heterocyclic amine include pyridine, 2-methylpyridine, 4-methylpyridine, 2-ethylpyridine, 4-ethylpyridine, 2-phenylpyridine, 4-phenylpyridine, N-methyl-4-phenylpyridine, 4-dimethylaminopyridine, imidazole, benzimidazole, 4-methylimidazole, 2-phenylbenzimidazole, 2,4,5-triphenylimidazole, nicotine, nicotinic acid, nicotinic acid amide, quinoline, 8-oxyquinoline, pyrazine, pyrazole, pyridazine, purine, pyrrolidine, piperidine, cyclohexyl morpholinoethyl thiourea, piperizine, morpholine, 4-methylmorpholine, 1,5-diazabicyclo[4.3.0]-5-nonene, and 1,8-diazabicyclo[5.3.0]-7-undecene.

Examples of the quaternary ammonium hydroxide include tetramethylammonium hydroxide, tetraethylammonium hydroxide, tetra-n-butylammonium hydroxide, and tetra-n-hexylammonium hydroxide.

Examples of the quaternary ammonium salts of carboxylic acid include tetramethylammonium acetate, tetramethylammonium benzoate, tetra-n-butylammonium acetate, and tetra-n-butylammonium benzoate.

The basic compound which can be used in the present invention may be used alone or in combination of two or more kinds thereof, but a combination of two or more kinds thereof is preferable, a combination of two kinds thereof is more preferable, and a combination of two kinds of heterocyclic amine is still more preferable.

In a case where the photosensitive resin composition of the present invention contains a basic compound, the content of the basic compound is preferably in a range of 0.001 to 1 part by mass and more preferably in a range of 0.002 to 0.2 parts by mass with respect to 100 parts by mass of the photosensitive resin.

Surfactant

It is preferable that the photosensitive resin composition of the present invention contains a surfactant.

As the surfactant, any of an anionic surfactant, a cationic surfactant, a non-ionic surfactant, and an amphoteric surfactant can be used, but a preferable surfactant is a non-ionic surfactant.

Examples of the non-ionic surfactant include polyoxyethylene higher alkyl ethers, polyoxyethylene higher alkyl phenyl ethers, higher fatty acid diesters of polyoxyethylene glycol, a fluorine-based surfactant, and a silicone-based surfactant.

It is more preferable that the photosensitive resin composition of the present invention contains a fluorine-based surfactant and/or a silicone-based surfactant as a surfactant.

As the fluorine-based surfactant and the silicone-based surfactant, surfactants described in JP1987-36663A (JP-S62-36663A), JP1986-226746A (JP-S61-226746A), JP1986-2267451 (JP-S61-2267451), JP1987-170950A (JP-S62-170950A), JP1988-34540A (JP-S63-34540A), JP1995-230165A (JP-H7-230165A), JP1996-62834A (JP-H8-62834A), JP1997-54432A (JP-H9-54432A), JP1997-5988A (JP-H9-5988A), and JP2001-330953A can be exemplified, and commercially available surfactants can be also used.

Examples of the commercially available surfactants which can be used include fluorine-based surfactants and silicone based surfactants such as F TOP EF301 and F TOP EF303 (both manufactured by Shin Akita Kasei Inc.), FLUORAD FC430 and FLUORAD FC431 (both manufactured by Sumitomo 3M Limited), MEGAFACE F171, MEGAFACE F173, MEGAFACE F176, MEGAFACE F189, and MEGAFACE R08 (all manufactured by DIC Corporation), SURFLON S-382, SURFLON SC101, SURFLON SC102, SURFLON SC103, SURFLON SC104, SURFLON SC105, and SURFLON SC106 (all manufactured by ASAHI GLASS CO., LTD.), and the PF-6320 PolyFox Series of and the like (manufactured by OMNOVA Solution Inc.). In addition, polysiloxane polymer KP-341 (manufactured by Shin-Etsu Chemical Co., Ltd.) can be also used as a silicone-based surfactant.

Further, as a surfactant, a copolymer which contains a constitutional unit A and a constitutional unit B which are represented by Formula (1) and whose weight average molecular weight (Mw) measured by gel permeation chromatography in terms of polystyrene is in a range of 1,000 to 10,000 in a case where tetrahydrofuran (THF) is used as a solvent is preferably exemplified.

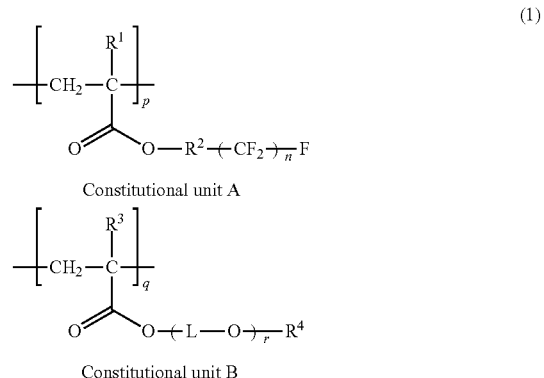

(In Formula (1), $R^1$ and $R^3$ each independently represent a hydrogen atom or a methyl group; $R^2$ represents a linear alkylene group having 1 to 4 carbon atoms; $R^4$ represents a hydrogen atom or an alkyl group having 1 to 4 carbon atoms; L represents an alkylene group having 3 to 6 carbon atoms, p and q represent the mass percentages showing a polymerization ratio; p represents a numerical value of 10% by mass to 80% by mass; q represents a numerical value of 20% by mass to 90% by mass; r represents an integer of 1 to 18; and n represents an integer of 1 to 10.)

It is preferable that L represents a branched alkylene group represented by Formula (2). $R^5$ in Formula (2) represents an alkyl group having 1 to 4 carbon atoms, and an alkyl group having 1 to 3 carbon atoms is preferable and an alkyl group having 2 or 3 carbon atoms is more preferable in terms of compatibility and wettability with respect to a surface to be coated.

The weight-average molecular weight of the copolymer is more preferably in a range of 1,500 to 5,000. These surfactants can be used alone or in combination of two or more kinds thereof.

In a case where the photosensitive resin composition of the present invention contains a surfactant, the amount of the surfactant to be added is preferably 10 parts by mass or less, more preferably in a range of 0.01 to 10 parts by mass, and still more preferably in a range of 0.01 to 1 part by mass with respect to 100 parts by mass of the photosensitive resin.

Moreover, as necessary, one or two or more known additives such as an antioxidant, a plasticizer, a thermal radical generator, a thermal acid generator, an acid proliferation agent, an ultraviolet absorber, a thickener, and an organic or inorganic precipitation inhibitor can be added to the photosensitive resin composition of the present invention. The description of paragraphs 0143 to 0148 of JP2011-209692A can be referred to for the details and the contents thereof are incorporated in the specification of the present application.

<Kit>

A first kit of the present invention includes a composition for forming an organic semiconductor, a water-soluble resin composition containing a water-soluble resin, and a photosensitive resin composition containing a photosensitive resin. The water-soluble resin is at least one of polyvinylpyrrolidone having a weight-average molecular weight of 300,000 or greater or polyvinyl alcohol having a weight-average molecular weight of 15,000 or greater, and the photosensitive resin has a weight-average molecular weight of 30,000 or greater. The preferable ranges of the components of the organic semiconductor composition, the water-soluble resin composition, and the photosensitive resin composition are the same as described above.

A second kit of the present invention is a kit used for patterning of an organic semiconductor film and contains a water-soluble resin composition containing a water-soluble resin and a photosensitive resin composition containing a photosensitive resin. The water-soluble resin is at least one of polyvinylpyrrolidone having a weight-average molecular weight of 300,000 or greater or polyvinyl alcohol having a weight-average molecular weight of 15,000 or greater, and the photosensitive resin has a weight-average molecular weight of 30,000 or greater. The preferable ranges of the components of the water-soluble resin composition and the photosensitive resin composition are the same as described above. Further, the patterning of the organic semiconductor film will be described later.

<Method of Patterning Organic Semiconductor Film>

The method of patterning the organic semiconductor film of the present invention includes:

(1) a step of forming a water-soluble resin layer on the organic semiconductor film;

(2) a step of forming a photosensitive resin layer on a side of the water-soluble resin layer opposite to the organic semiconductor film;

(3) a step of exposing the photosensitive resin layer to light;

(4) a step of performing development using a developer containing an organic solvent to prepare a mask pattern;

(5) a step of removing the water-soluble resin layer and the organic semiconductor film in at least a non-mask portion during a dry etching treatment; and (6) a step of dissolving the water-soluble resin layer using water.

<<(1) Step of Forming Water-Soluble Resin Layer on Organic Semiconductor Film>>

The method of patterning the organic semiconductor film includes a step of forming a water-soluble resin layer on the organic semiconductor film. The present step is typically performed after the organic semiconductor film is formed on the substrate. In this case, the water-soluble resin layer is formed on a surface on the opposite side of the surface on the substrate side of the organic semiconductor. The water-soluble resin layer is typically provided on a surface of the organic semiconductor film, but other layers may be provided within the range not departing from the scope of the present invention. Specifically, a water-soluble undercoat layer is exemplified. In addition, only one or two or more water-soluble resin layers may be provided.

It is preferable that the water-soluble resin layer is formed using the water-soluble resin composition as described above.

<<(2) Step of Forming Photosensitive Resin Layer on Side of Water-Soluble Resin Layer Opposite to Organic Semiconductor Film>>

After the step (1) described above, the step (2) of forming a photosensitive resin layer on a side of the water-soluble resin layer opposite to the organic semiconductor film is carried out using the photosensitive resin composition. It is preferable that the photosensitive resin layer is formed using the photosensitive resin composition as described above and more preferable that the photosensitive resin layer is formed using a chemically amplified photosensitive resin composition containing a photosensitive resin and a photoacid generator.

The chemically amplified photosensitive resin composition used in the present invention contains a photoacid generator, an acid is generated when the composition is exposed to light, the photosensitive resin contained in a resist responds to the exposure, the patterning becomes possible, and then the composition functions as a photosensitive resin layer.

The concentration of solid contents in the photosensitive resin composition is typically in a range of 1.0% to 20% by mass, preferably in a range of 1.5% to 17% by mass, and more preferably in a range of 2.0% to 15% by mass. By setting the concentration of solid contents to be in the above-described range, the water-soluble resin layer can be uniformly coated with the photosensitive resin composition and a resist pattern which has high resolution and a rectangular profile can be formed. The concentration of solid contents is a mass percentage of resist components other than the organic solvent with respect to the total mass of the photosensitive resin composition.

<<(3) Step of Exposing Photosensitive Resin Layer to Light>>

After the photosensitive resin layer is formed during the step (2), the photosensitive resin layer is exposed to light. Specifically, the photosensitive resin layer is irradiated with active rays through a mask having a predetermined pattern. The photosensitive resin layer may be exposed to light only once or multiple times.

Specifically, a substrate provided with a dried coating film of the photosensitive resin composition is irradiated with active rays having a predetermined pattern. The substrate may be exposed to light through a mask or the predetermined pattern may be directly drawn. Active rays having a wavelength of 300 nm to 450 nm and preferably a wavelength of 365 nm are preferably used. After this step, a post-exposure baking (PEB) step may be performed as necessary.

A low-pressure mercury lamp, a high-pressure mercury lamp, an ultra-high pressure mercury lamp, a chemical lamp, a laser generator, or a light emitting diode (LED) light source can be used for exposure using active rays.

In a case of using a mercury lamp, active rays having a wavelength of g-line (436 nm), a wavelength of i-line (365 nm), and a wavelength of h-line (405 nm) can be preferably used. In the present invention, a mercury lamp is suitable in a case where i-line is used.

In a case of using a laser, a solid (YAG) laser having a wavelength of 343 nm or 355 nm is suitably used, an excimer laser having a wavelength of 351 nm (XeF) is suitably used, and a semiconductor laser having a wavelength of 375 nm or 405 nm is suitably used. Among these, from the viewpoints of stability or the cost, a wavelength of 355 nm or 405 nm is more preferable. The photosensitive resin layer can be irradiated with a laser once or multiple times.

The energy density per pulse of a laser is preferably in a range of 0.1 mJ/cm² to 10,000 mJ/cm². In order for the coating film to be sufficiently cured, the energy density thereof is more preferably 0.3 mJ/cm² or greater and still more preferably 0.5 mJ/cm² or greater. In order for the coating film to not be decomposed by an ablation phenomenon, the energy density is more preferably 1,000 mJ/cm² or less and still more preferably 100 mJ/cm² or less.

Further, the pulse width is preferably in a range of 0.1 nano seconds (hereinafter, referred to as "nsec") to 30,000 nsec. In order for the colored coating film to not be decomposed by an ablation phenomenon, the pulse width is more preferably 0.5 nsec or greater and still more preferably 1 nsec or greater. Further, in order to improve aligning accuracy at the time of scanning exposure, the pulse width is more preferably 1,000 nsec or less and still more preferably 50 nsec or less.

In addition, the frequency of the laser is preferably in a range of 1 Hz to 50,000 Hz and more preferably in a range of 10 Hz to 1,000 Hz.

Moreover, in order to shorten the time for the exposure treatment, the frequency of the laser is more preferably 10 Hz or greater and still more preferably 100 Hz or greater. In order to improve aligning accuracy at the time of scanning exposure, the frequency of the laser is more preferably 10,000 Hz or less and still more preferably 1,000 Hz or less.

In a case where a laser is compared to a mercury lamp, a laser is preferable in terms that a laser can be more easily focused and a mask for pattern formation during the exposure step is unnecessary and this leads to cost reduction.

An exposure device which can be used in the present invention is not particularly limited, and a CALLISTO (manufactured by V-Technology Co., Ltd.), a AEGIS (manufactured by V-Technology Co., Ltd.), or a DF2200G (manufactured by SCREEN Holdings Co., Ltd.) can be exemplified as a commercially available product. Further, devices other that these described above are suitably used.

Moreover, irradiation light can be adjusted through a spectral filter such as a long wavelength cut filter, a short wavelength cut filter, and a band-pass filter as necessary.

<<(4) Step of Performing Development using Developer Containing Organic Solvent to Prepare Mask Pattern>>

After the photosensitive resin layer is exposed by the step (3), development is performed using a developer containing an organic solvent (hereinafter, also referred to as an "organic developer"). It is preferable that the development is of a negative type. The sp value of the solvent contained in the developer is preferably less than 19 MPa$^{1/2}$ and more preferably 18 MPa$^{1/2}$ or less.

As the organic solvent contained in the developer used in the present invention, a polar solvent such as a ketone-based solvent, an ester-based solvent, or an amide-based solvent and a hydrocarbon-based solvent can be used.

Examples of the ketone-based solvent include 1-octanone, 2-octanone, 1-nonanone, 2-nonanone, 2-heptanone (methyl amyl ketone), 4-heptanone, 1-hexanone, 2-hexanone, diisobutyl ketone, cyclohexanone, methyl cyclohexanone, phenyl acetone, methyl ethyl ketone, methyl isobutyl ketone, acetylacetone, acetonylacetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, methyl formate, ethyl formate, butyl formate, propyl formate, ethyl lactate, butyl lactate, and propyl lactate.

Examples of the amide-based solvent include N-methyl-2-pyrrolidone, N,N-dimethylacetamide, N,N-dimethylformamide, hexamethyl phosphoric triamide, and 1,3-dimethyl-2-imidazolidinone.

Examples of the hydrocarbon-based solvent include an aromatic hydrocarbon-based solvent such as toluene or xylene and an aliphatic hydrocarbon-based solvent such as pentane, hexane, octane, or decane.

The above-described organic solvents may be used alone or in combination of two or more kinds thereof. In addition, the organic solvents may be used by being mixed with solvents other than the solvents described above. In this case, for the purpose of sufficiently exhibiting the effects of the present invention, it is preferable that the moisture content in a whole developer is less than 10% by mass and more preferable that substantially no moisture is contained. The term "substantially" here means that the moisture content in a whole developer is 3% by mass or less and more preferably below the measurement limit.

That is, the amount of the organic solvent used with respect to an organic developer is preferable in a range of 90% by mass to 100% by mass and more preferably in a range of 95% by mass to 100% by mass with respect to the total amount of the developer.

Particularly, it is preferable that the organic developer contains at least one organic solvent selected from the group consisting of a ketone-based solvent, an ester-based solvent, and an amide-based solvent.

In addition, the organic developer may contain an appropriate amount of a basic compound as necessary. Examples of the basic compound are the same as those described above in the section of the basic compound.

The vapor pressure of the organic developer at 20° C. is preferably 5 kPa or less, more preferably 3 kPa or less, and still more preferably 2 kPa or less. When the vapor pressure of the organic developer is set to 5 kPa or less, evaporation on a substrate of the developer or in a developing cup is suppressed, temperature uniformity in a wafer surface is improved, and thus dimensional uniformity in the wafer surface is improved.

Specific examples of a solvent having a vapor pressure of 5 kPa or less include a ketone-based solvent such as 1-octanone, 2-octanone, 1-nonanone, 2-nonanone, 2-heptanone (methyl amyl ketone), 4-heptanone, 2-hexanone, diisobutyl ketone, cyclohexanone, methyl cyclohexanone, phenyl acetone, or methyl isobutyl ketone; an ester-based solvent such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, butyl formate, propyl formate, ethyl lactate, butyl lactate, or propyl lactate; an amide-based solvent such as N-methyl-2-pyrrolidone, N,N-dimethylacetamide, or N,N-dimethylformamide; an aromatic hydrocarbon-based solvent such as toluene or xylene; and an aliphatic hydrocarbon-based solvent such as octane or decane.

Specific examples of a solvent having a vapor pressure of 2 kPa or less which is the particularly preferred range include a ketone-based solvent such as 1-octanone, 2-octanone, 1-nonanone, 2-nonanone, 4-heptanone, 2-hexanone, diisobutyl ketone, cyclohexanone, methyl cyclohexanone, or phenyl acetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, ethyl lactate, butyl lactate, or propyl lactate; an amide-based solvent such as N-methyl-2-pyrrolidone, N,N-dimethylacetamide, or N,N-dimethylformamide; an aromatic hydrocarbon-based solvent such as xylene; and an aliphatic hydrocarbon-based solvent such as octane or decane.

An appropriate amount of one or two or more surfactants can be added to the developer as necessary.

The surfactants described in the section of the water-soluble resin composition are preferably used as the surfactants although not particularly limited.

In a case where a surfactant is mixed with the developer, the content is normally in a range of 0.001% by mass to 5% by mass, preferably in a range of 0.005% by mass to 2% by mass, and still more preferably in a range of 0.01% by mass to 0.5% by mass with respect to the total amount of the developer.

As a developing method, a method of immersing a substrate in a bath filled with a developer for a certain period of time (dip method); a method of performing development by raising a developer onto the surface of a substrate using the surface tension and allowing the developer to stand still for a certain period of time (paddle method); a method of spraying a developer on the surface of a substrate (spray method); and a method of discharging a developer while a developer discharge nozzle is scanned at a constant rate on a substrate that rotates at a constant rate (dynamic dispense method) can be used.

In a case where the various developing methods include a method of discharging a developer to a photosensitive resin layer from a development nozzle of a developing device, the discharge pressure (the flow rate per unit area of the developer to be discharged) of the developer to be discharged is preferably in a range of 2 mL/sec/mm$^2$ or less, more preferably 1.5 mL/sec/mm$^2$ or less, and still more preferably 1 mL/sec/mm$^2$ or less. The lower limit of the flow rate is not particularly limited, but is preferably 0.2 mJ/sec/mm$^2$ or greater when throughput is considered.

When the discharge pressure of the developer to be discharged is set to be in the above-described range, defects in a pattern derived from resist residues after development can be significantly reduced.

The details of this mechanism are not clear, but it is considered that the defects can be reduced because the pressure of the developer being applied to the photosensitive resin layer is decreased and thus unexpected scraping or collapsing of the resist pattern on the photosensitive resin layer is suppressed by setting the discharge pressure to be in the above-described range.

In addition, the discharge pressure (mL/sec/mm$^2$) of the developer is a value in a developing nozzle outlet in the developing device.

Examples of a method of adjusting the discharge pressure of the developer include a method of adjusting the discharge pressure using a pump or the like and a method of adjusting and changing the discharge pressure with a supply from a pressure tank.

Further, after the step of performing development using the developer containing an organic solvent, a step of stopping development may be carried out while the organic solvent is replaced by another organic solvent.

<<(5) Step of Removing Water-Soluble Resin Layer and Organic Semiconductor Film in at Least Non-Mask Portion During Dry Etching Treatment>>

For example, the photosensitive resin layer is developed and a mask pattern is prepared, and then the water-soluble resin layer and the organic semiconductor film in at least a non-mask portion are removed during the etching treatment. The non-mask portion indicates a portion which is not exposed to light due to a mask when a mask pattern is prepared by exposing the photosensitive resin layer to light.

Specifically, during the dry etching treatment, the resist pattern is used as an etching mask and at least the water-soluble resin layer and the organic semiconductor film are dry-etched. Typical examples of the dry etching include methods described in JP1984-126506A (JP-S59-126506A), JP1984-46628A (JP-S59-46628A), JP1983-9108A (JP-S58-9108A), JP1983-2809A (JP-S58-2809A), JP1982-148706A (JP-S57-148706A), and JP1986-41102A (JP-S61-41102A).

It is preferable that the dry etching is performed by following an aspect described below from viewpoints of forming a pattern section to have a shape close to a rectangular shape and further reducing damage to the organic semiconductor film.

An aspect which includes a first step of etching that performs etching up to a region (depth) to which the organic semiconductor film is not exposed using a mixed gas of fluorine-based gas and oxygen gas ($O_2$), a second step of etching that performs etching preferably close to a region (depth) to which the organic semiconductor film is exposed using mixed gas of nitrogen gas ($N_2$) and oxygen gas ($O_2$) after the first step of etching, and over-etching performed after the organic semiconductor film is exposed is preferable. Hereinafter, a specific method of the dry etching, the first step of etching, the second step of etching and the over-etching will be described.

The dry etching is performed by acquiring etching conditions in advance using the following method.

(1) An etching rate (nm/min) in the first step of etching and an etching rate (nm/min) in the second step of etching are respectively calculated. (2) The etching time over which a desired thickness is obtained by the first step of etching and the etching time over which a desired thickness is obtained by the second step of etching are respectively calculated. (3) The first step of etching is performed according to the etching time calculated in the process (2) described above. (4) The second step of etching is performed according to the etching time calculated in the process (2) described above. Alternatively, the etching time is determined by end point detection and then the second step of etching may be performed according to the determined etching time. (5) The over-etching time with respect to the total time of (3) and (4) described above is calculated and the over-etching is performed.

It is preferable that the mixed gas used in the first step of the etching process contains fluorine-based gas and oxygen gas ($O_2$) from a viewpoint of processing an organic material, which is a film to be etched, to have a rectangular shape. Moreover, in the first step of the etching process, damage to the organic semiconductor film can be avoided by performing etching up to a region to which the organic semiconductor film is not exposed. In addition, it is preferable that the etching treatment is performed using a mixed gas of nitrogen gas and oxygen gas in the second step of the etching process and the over-etching process from a viewpoint that the etching is performed up to the region to which the organic semiconductor film is not exposed using a mixed gas of fluorine-based gas and oxygen gas during the first step of the etching process and thus damage to the organic semiconductor film is avoided.

It is important that the ratio of the etching amount during the first step of the etching process to the etching amount during the second step of the etching process is determined such that the rectangular properties due to the etching treatment during the first step of the etching process are not degraded. In addition, the ratio of the etching amount in the second step of the etching process to the total etching amount (the total amount of the etching amount in the first step of the etching process and the etching amount in the second step of the etching process) is preferably greater than 0% and equal to or less than 50% and more preferably in a range of 10% to 20%. The etching amount indicates the amount calculated from a difference between the film thickness of a remaining film to be etched and the film thickness before etching.

In addition, it is preferable that the etching includes the over-etching treatment. It is preferable that the over-etching treatment is performed by setting an over-etching ratio. Further, it is preferable that the over-etching ratio is calculated from the time for the etching treatment which is carried out for the first time. The over-etching ratio can be arbitrarily set, but the over-etching ratio is preferably 30% or less, more preferably 5% to 25%, and particularly preferably 10% to 15% of the etching treatment time in this etching process from a viewpoint of maintaining etching resistance of a photoresist and rectangular properties of a pattern to be etched.

<<(6) Step of Dissolving Water-Soluble Resin Layer in Water to be Removed>>

After the etching, the water-soluble resin layer is removed using a solvent (typically, water).

As a method of removing the water-soluble resin layer using water, a method of spraying cleaning water to the resist pattern from a spray type or shower type spray nozzle and removing the water-soluble resin layer is exemplified. As the cleaning water, pure water can be preferably used. Further, as the spray nozzle, a spray nozzle in which the entire support is included in the spray range or a spray nozzle which is a movable spray nozzle and in which the entire support is included in the movable range can be exemplified. In a case where the spray nozzle is a movable type nozzle, the resist pattern can be more effectively removed by moving the spray nozzle from the center portion of the support to the end portion of the support two or more times during the step of removing the water-soluble resin layer and spraying cleaning water.

It is preferable that a step of drying or the like is performed after water is removed. The drying temperature is preferably in a range of 80° C. to 120° C.

<Applications>

The laminate and the kit of the present invention can be used for production of an electronic device obtained by using an organic semiconductor. Here, the electronic device indicates a device that includes a semiconductor and two or more electrodes and controls a current flowing between the electrodes and a voltage to be generated using electricity, light, magnetism, and chemical substances or a device that generates light, an electric field, or a magnetic field using an applied voltage or a current. Examples thereof include an organic photoelectric conversion element, an organic field effect transistor, an organic electroluminescence light emitting device, a gas sensor, an organic rectifying element, an organic inverter, and an information recording element. The organic photoelectric conversion element can be used for a light sensor and energy conversion (solar cell). Among these, an organic field effect transistor, an organic photoelectric conversion element, or an organic electroluminescence light emitting device is preferable, an organic field effect transistor or an organic photoelectric conversion element is more preferable, and an organic field effect transistor is particularly preferable.

EXAMPLES

Hereinafter, the present invention will be described in more detail with reference to examples, but the present invention is not limited to the examples described below unless departing from the scope of the present invention. Further, "%" and "parts" are on a mass basis unless otherwise noted.

<Method of Measuring Weight-Average Molecular Weight and Number Average Molecular Weight>

In the present specification, the weight-average molecular weight (Mw) is defined as a value obtained by GPC measurement in terms of polystyrene. In the present specification, a weight-average molecular weight (Mw) and a number average molecular weight (Mn) can be acquired, for example, using an HLC-8220 (manufactured by TOSOH CORPORATION), and TSKgel Super AWM-H (6.0 mm ID×15.0 cm manufactured by TOSOH CORPORATION) as a column. The measurement is carried out using 10 mmol/L lithium bromide NMP (N-methylpyrrolidinone) solution as an eluant unless otherwise noted.

<Synthesis of Photosensitive Resin 1-1 (Mw=30,000)>

PGMEA (32.62 g) was put into a 200 mL three neck flask provided with a nitrogen introduction pipe and a cooling pipe and the flask was heated to 86° C. A solution obtained by dissolving benzyl methacrylate (BzMA) (16.65 g), tetrahydrofuran-2-yl acrylate (THFAA) (19.19 g), t-butyl methacrylate (t-BuMA) (5.76 g), and V-601 (dimethyl 2,2'-azobis(2-methylpropionate), (manufactured by Wako Pure Chemical Industries, Ltd.)) (0.8082 g, 1.30 mol % with respect to monomers) in PGMEA (32.62 g) was added dropwise to the flask for 2 hours. Thereafter, the reaction solution was stirred for 2 hours and the reaction was completed. White powder generated by re-precipitating the reaction solution in heptane was recovered by filtration, thereby obtaining a photosensitive resin 1-1. The weight-average molecular weight (Mw) was 30,000.

The amount of component having a weight-average molecular weight (Mw) of 1,000 or less was 3% by mass.

<Synthesis of Photosensitive Resin 1-2 (Mw=45,000)>

PGMEA (32.62 g) was put into a 200 mL three neck flask provided with a nitrogen introduction pipe and a cooling pipe and the flask was heated to 86° C. A solution obtained by dissolving BzMA (16.65 g), THFAA (19.19 g), t-BuMA (5.76 g), and V-601 (0.4663 g, 0.75 mol % with respect to monomers) in PGMEA (32.62 g) was added dropwise to the flask for 2 hours. Thereafter, the reaction solution was stirred for 2 hours and the reaction was completed. White powder generated by re-precipitating the reaction solution in heptane was recovered by filtration, thereby obtaining a photosensitive resin 1-2. The weight-average molecular weight (Mw) was 45,000.

The amount of component having a weight-average molecular weight (Mw) of 1,000 or less was 3% by mass.

<Synthesis of Photosensitive Resin 1-3 (Mw=15,000)>

PGMEA (32.62 g) was put into a 200 mL three neck flask provided with a nitrogen introduction pipe and a cooling pipe and the flask was heated to 86° C. A solution obtained by dissolving BzMA (16.65 g), THFAA (19.19 g), t-BuMA (5.76 g), and V-601 (1.9329 g, 3.11 mol % with respect to monomers) in PGMEA (32.62 was added dropwise to the flask for 2 hours. Thereafter, the reaction solution was stirred for 2 hours and the reaction was completed. White powder generated by re-precipitating the reaction solution in heptane was recovered by filtration, thereby obtaining a photosensitive resin 1-3. The weight-average molecular weight (Mw) was 15,000.

The amount of component having a weight-average molecular weight (Mw) of 1,000 or less was 3% by mass.

<Synthesis of Photosensitive Resin 2-1 (Mw=30,000)>

PGMEA (32.62 g) was put into a 200 mL three neck flask provided with a nitrogen introduction pipe and a cooling pipe and the flask was heated to 86° C. A solution obtained by dissolving BzMA (16.65 g), tetrahydrofuran-2-yl methacrylate (THFMA) (21.08 g), t-BuMA (5.76 g), and V-601 (0.8082 g) in PGMEA (32.62 g) was added dropwise to the flask for 2 hours. Thereafter, the reaction solution was stirred for 2 hours and the reaction was completed. White powder generated by re-precipitating the reaction solution in heptane was recovered by filtration, thereby obtaining a photosensitive resin 2-1. The weight-average molecular weight (Mw) was 30,000.

The amount of component having a weight-average molecular weight (Mw) of 1,000 or less was 3% by mass.

<Synthesis of Photosensitive Resin 2-2 (Mw=45,000)>

PGMEA (32.62 g) was put into a 200 mL three neck flask provided with a nitrogen introduction pipe and a cooling pipe and the flask was heated to 86° C. A solution obtained by dissolving BzMA (16.65 g), THFMA (21.08 g), t-BuMA (5.76 g), and V-601 (0.4663 g) in PGMEA (32.62 g) was added dropwise to the flask for 2 hours. Thereafter, the reaction solution was stirred for 2 hours and the reaction was completed. White powder generated by re-precipitating the reaction solution in heptane was recovered by filtration, thereby obtaining a photosensitive resin 2-2. The weight-average molecular weight (Mw) was 45,000.

The amount of component having a weight-average molecular weight (Mw) of 1,000 or less was 3% by mass.

<Synthesis of Photosensitive Resin 2-3 (Mw=15,000)>

PGMEA (32.62 g) was put into a 200 mL three neck flask provided with a nitrogen introduction pipe and a cooling pipe and the flask was heated to 86° C. A solution obtained by dissolving BzMA (16.65 g), THFMA (21.08 g), t-BuMA (5.76 g), and V-601 (1.9329 g) in PGMEA (32.62 g) was added dropwise to the flask for 2 hours. Thereafter, the reaction solution was stirred for 2 hours and the reaction was completed. White powder generated by re-precipitating the reaction solution in heptane was recovered by filtration, thereby obtaining a photosensitive resin 2-3. The weight-average molecular weight (Mw) was 15,000.

The amount of component having a weight-average molecular weight (Mw) of 1,000 or less was 3% by mass.

<PVP-1 (Mw=360,000)>, manufactured by Tokyo Chemical Industry Co., Ltd., polyvinylpyrrolidone K90

<PVP-2 (Mw=10,000)>, manufactured by Tokyo Chemical Industry Co., Ltd., polyvinylpyrrolidone K15

<PVP-3 (Mw=40,000)>, manufactured by Tokyo Chemical Industry Co., Ltd., polyvinylpyrrolidone K30

<PVA-1 (Mw=15,000)>, manufactured by KURARAY CO., LTD., PVA-203 degree of polymerization of 300

<PVA-2 (Mw=24,000)>, manufactured by KURARAY CO., LTD., PVA-205 degree of polymerization of 500

<Water-Soluble Resin Composition>

| | |
|---|---|
| Water-soluble resin listed in Table 1 | 15.0 parts by mass |
| Surfactant (manufacturer: Kawaken Fine Chemicals Co., Ltd., product number: Acetylenol E00) | 0.008 parts by mass |
| Water | 84.9 parts by mass |

Photoacid Generator (Compound X)

In Formula OS-107, a compound in which $R^{11}$ represents a toluyl group and $R^{18}$ represents a methyl group was employed.

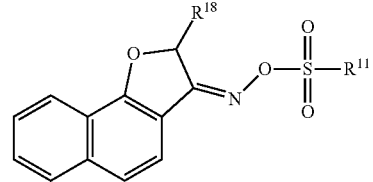

(OS-107)

Basic Compound (Compound Y)

Thiourea derivative shown in the following formula

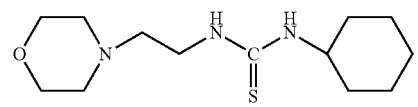

<Photosensitive Resin Composition 1>

| | |
|---|---|
| Photosensitive resin listed in Table 1 | 29.45 parts by mass |
| Photoacid generator (compound X, manufactured by Daito Chemix Corp.) | 0.6 parts by mass |
| Basic compound (compound Y, manufactured by DSP GOKYO FOOD & CHEMICAL Co., Ltd. | 0.06 parts by mass |
| Surfactant (manufacturer: OMNOVA Solutions Inc., product number: PF-6320) | 0.09 parts by mass |
| Organic solvent (propylene glycol monomethyl ether acetate) | 70 parts by mass |

<Photosensitive Resin Composition 2>

| | |
|---|---|
| Photosensitive resin listed in Table 1 | 25.09 parts by mass |
| Photoacid generator (compound X, manufactured by Daito Chemix Corp.) | 0.26 parts by mass |
| Basic compound (compound Y, manufactured by DSP (GOKYO FOOD & CHEMICAL Co,, Ltd.) | 0.08 parts by mass |
| Surfactant (manufacturer: OMNOVA Solutions Inc., product number: PF-6320) | 0.08 parts by mass |
| Organic solvent (propylene glycol monomethyl ether acetate) | 74.5 parts by mass |

Preparation of Organic Semiconductor Substrate

An organic semiconductor film was formed by spin-coating a glass substrate with a size of 5 cm square with an organic semiconductor coating solution (composition for forming an organic semiconductor) having the following composition and drying the glass substrate at 130° C. for 10 minutes. The film thickness was 150 nm.

Composition of Organic Semiconductor Coating Solution:

| | |
|---|---|
| P3HT (manufactured by Sigma-Aldrich Co., LLC.) | 10% by mass |
| PCBM (manufactured by Sigma-Aldrich Co., LLC.) | 10% by mass |
| Chloroform (manufactured by Wako Pure Chemical industries, Ltd.) | 80% by mass |

Formation of Water-Soluble Resin Layer

A water-soluble resin layer having a thickness listed in the table was formed by spin-coating the surface of the organic semiconductor film with a water-soluble resin composition and drying the film at 100° C. for 1 minute.

Formation of Photosensitive Resin Layer

A photosensitive resin layer having a thickness listed in the table was formed by spin-coating the surface of the formed water-soluble resin layer with a photosensitive resin composition and drying the layer at 100° C. for 1 minute.

Presence of Cracks

The presence of cracks on the surface of the photosensitive resin layer was evaluated and the evaluation was performed with respect to the entire surface (706 cm$^2$) of a water having a size of 300 mm. The results are listed in Table 1.

A: Cracks were not found.
B: Cracks were found at the corner of a 100 μm contact hole pattern in the photosensitive resin layer.
C: Cracks were found on a flat portion of the photosensitive resin layer.
D: The flat portion of the photosensitive resin layer was peeled off due to cracks so that the underlying organic semiconductor film was seen.

A laminate was formed in the same manner as in Example 7 except that a mixture (mixing mass ratio of 50:50) of PVA-2 (Mw=20,000) and PVP-1 (Mw=360,000) was used in place of PVP-1 (Mw=360,000) as a water-soluble resin in Example 7. Thereafter, cracks were evaluated and no cracks were found (evaluated as A).

As evident from the results described above, it was understood that occurrence of cracks was able to be effectively suppressed when the laminate of the present invention was used. On the contrary, in the laminates of the comparative examples, cracks occurred.

EXPLANATION OF REFERENCES

1: organic semiconductor film
2: water-soluble resin layer
3: photosensitive resin layer

What is claimed is:

1. A laminate comprising:
a water-soluble resin layer which contains a water-soluble resin and a photosensitive resin layer which contains a photosensitive resin, which are provided in this order on an organic semiconductor film,
wherein the water-soluble resin layer and the photosensitive resin layer are adjacent to each other,
the water-soluble resin is at least one of polyvinylpyrrolidone having a weight-average molecular weight of 300,000 or greater or polyvinyl alcohol having a weight-average molecular weight of 15,000 or greater,
the photosensitive resin has a weight-average molecular weight of 30,000 or greater, and the thickness of the

TABLE 1

| | Photosensitive resin | Molecular weight of photosensitive resin (Mw) | Film thickness of photosensitive resin layer (μm) | Water-soluble resin | Molecular weight of water-soluble resin (Mw) | Film thickness of water-soluble resin layer (μm) | Cracks |
|---|---|---|---|---|---|---|---|
| Example 1 | 1 | 30,000 | 0.6 | PVP-1 | 360,000 | 2 | A |
| Example 2 | 1 | 45,000 | 0.6 | PVP-1 | 360,000 | 2 | A |
| Example 3 | 1 | 45,000 | 0.6 | PVA-1 | 15,000 | 2 | A |
| Example 4 | 2 | 45,000 | 2 | PVP-1 | 360,000 | 0.6 | A |
| Example 5 | 2 | 45,000 | 2 | PVP-1 | 360,000 | 0.6 | A |
| Example 6 | 2 | 45,000 | 2 | PVA-1 | 15,000 | 0.6 | A |
| Example 7 | 2 | 30,000 | 2 | PVP-1 | 360,000 | 2 | A |
| Example 8 | 2 | 45,000 | 2 | PVP-1 | 360,000 | 2 | A |
| Example 9 | 2 | 45,000 | 2 | PVA-2 | 24,000 | | A |
| Comparative Example 1 | 1 | 15,000 | 0.6 | PVP-2 | 10,000 | 2 | C |
| Comparative Example 2 | 1 | 15,000 | 0.6 | PVP-3 | 40,000 | 2 | C |
| Comparative Example 3 | 1 | 15,000 | 0.6 | PVA-1 | 15,000 | 2 | B |
| Comparative Example 4 | 2 | 15,000 | 2 | PVP-2 | 10,000 | 0.6 | C |
| Comparative Example 5 | 2 | 15,000 | 2 | PVP-3 | 40,000 | 0.6 | C |
| Comparative Example 6 | 2 | 15,000 | 2 | PVA-2 | 24,000 | 0.6 | B |
| Comparative Example 7 | 2 | 15,000 | 2 | PVP-2 | 10,000 | 2 | D |
| Comparative Example 8 | 2 | 15,000 | 2 | PVP-3 | 40,000 | 2 | D |
| Comparative Example 9 | 2 | 15,000 | 2 | PVA-2 | 24,000 | 2 | D |
| Comparative Example 10 | 2 | 30,000 | 2 | PVP-3 | 40,000 | 2 | D | water-soluble resin layer is in a range of 0.1 to 10 μm, and the thickness of the photosensitive resin layer is in a range of 0.1 to 10 μm.

2. The laminate according to claim 1, wherein the photosensitive resin layer is a chemically amplified photosensitive resin layer.

3. The laminate according to claim 1, wherein the photosensitive resin layer is a negative type photosensitive resin layer.

4. The laminate according to claim 1, wherein an exposed portion of the photosensitive layer is hardly soluble in a developer containing an organic solvent.

5. The laminate according to claim 1, wherein the photosensitive resin has a cyclic ether ester structure.

6. The laminate according to claim 1, wherein the photosensitive resin has a constitutional unit having a group represented by Formula (1),

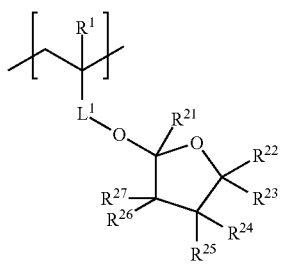

(1)

in Formula (1), $R^1$ represents a hydrogen atom or an alkyl group, $L^1$ represents a carbonyl group or a phenylene group, and $R^{21}$ to $R^{27}$ each independently represent a hydrogen atom or an alkyl group.

7. The laminate according to claim 1, wherein the weight-average molecular weight of the photosensitive resin is 40,000 or greater.

8. The laminate according to claim 1, wherein the amount of solvent contained in the water-soluble resin layer is in a range of 1% to 10% by mass, and the amount of organic solvent contained in the photosensitive resin layer is in a range of 1% to 10% by mass.

9. A laminate comprising:
a water-soluble resin layer which contains a water-soluble resin and a photosensitive resin layer which contains a photosensitive resin, which are provided in this order on an organic semiconductor film,
wherein the water-soluble resin layer and the photosensitive resin layer are adjacent to each other,
the water-soluble resin is at least one of polyvinylpyrrolidone having a weight-average molecular weight of 300,000 or greater or polyvinyl alcohol having a weight-average molecular weight of 15,000 or greater,
the photosensitive resin has a weight-average molecular weight of 30,000 or greater, and
the amount of component having a weight-average molecular weight of 1,000 or less, which is contained in the water-soluble resin, is 10% by mass or less of the entire water-soluble resin component.

10. A laminate comprising:
a water-soluble resin layer which contains a water-soluble resin and a photosensitive resin layer which contains a photosensitive resin, which are provided in this order on an organic semiconductor film,
wherein the water-soluble resin layer and the photosensitive resin layer are adjacent to each other,
the water-soluble resin is at least one of polyvinylpyrrolidone having a weight-average molecular weight of 300,000 or greater or polyvinyl alcohol having a weight-average molecular weight of 15,000 or greater,
the photosensitive resin has a weight-average molecular weight of 30,000 or greater, and
the amount of component having a weight-average molecular weight of 1,000 or less, which is contained in the photosensitive resin, is 10% by mass or less of the entire photosensitive resin component.

11. The laminate according to claim 1, further comprising:
a device substrate which is provided on a surface of the organic semiconductor film on a side far from the water-soluble resin layer.

12. The laminate according to claim 1, wherein the water-soluble resin layer is provided on a surface of the organic semiconductor film.

* * * * *